United States Patent
Chen et al.

(10) Patent No.: US 9,666,566 B1
(45) Date of Patent: May 30, 2017

(54) 3DIC STRUCTURE AND METHOD FOR HYBRID BONDING SEMICONDUCTOR WAFERS

(71) Applicant: Taiwan Semiconductor Manufacturing Company, Ltd., Hsin-Chu (TW)

(72) Inventors: Ju-Shi Chen, Tainan (TW); Cheng-Ying Ho, Minxiong Township (TW); Chun-Chieh Chuang, Tainan (TW); Sheng-Chau Chen, Tainan (TW); Shih Pei Chou, Tainan (TW); Hui-Wen Shen, Kaohsiung (TW); Dun-Nian Yaung, Taipei (TW); Ching-Chun Wang, Tainan (TW); Feng-Chi Hung, Chu-Bei (TW); Shyh-Fann Ting, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/138,993

(22) Filed: Apr. 26, 2016

(51) Int. Cl.
*H01L 23/02* (2006.01)
*H01L 25/10* (2006.01)
*H01L 25/00* (2006.01)

(52) U.S. Cl.
CPC .......... *H01L 25/105* (2013.01); *H01L 25/50* (2013.01); *H01L 2225/1041* (2013.01); *H01L 2225/1082* (2013.01)

(58) Field of Classification Search
CPC .................. H01L 21/447; H01L 21/76275
USPC .......................................................... 257/686
See application file for complete search history.

(56) References Cited

U.S. PATENT DOCUMENTS

| 2011/0233785 A1 | 9/2011 | Koester et al. |
| 2015/0249049 A1 | 9/2015 | Lin et al. |
| 2016/0086869 A1 | 3/2016 | Ahn et al. |

*Primary Examiner* — Elias M Ullah
(74) *Attorney, Agent, or Firm* — Slater Matsil, LLP

(57) ABSTRACT

Methods for improving hybrid bond yield for semiconductor wafers forming 3DIC devices includes first and second wafers having dummy and main metal deposited and patterned during BEOL processing. Metal of the dummy metal pattern occupies from about 40% to about 90% of the surface area of any given dummy metal pattern region. High dummy metal surface coverage, in conjunction with utilization of slotted conductive pads, allows for improved planarization of wafer surfaces presented for hybrid bonding. Planarized wafers exhibit minimum topographic differentials corresponding to step height differences of less than about 400 Å. Planarized first and second wafers are aligned and subsequently hybrid bonded with application of heat and pressure; dielectric-to-dielectric, RDL-to-RDL. Lithography controls to realize WEE from about 0.5 mm to about 1.5 mm may also be employed to promote topographic uniformity at wafer edges. Improved planarity of wafers presented for hybrid bonding results in improved bond uniformity for 3DIC devices formed thereby.

20 Claims, 19 Drawing Sheets

3DIC STRUCTURE AND METHOD FOR HYBRID BONDING SEMICONDUCTOR WAFERS

BACKGROUND

Semiconductor devices are used in a variety of electronic applications, such as personal computers, mobile phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits (ICs) are typically manufactured on a single semiconductor wafer, and individual dies on the wafer are singulated by sawing between the ICs along scribe lines. The individual dies are typically packaged separately, in multi-chip modules, or in other types of packaging, for example.

As demands for miniaturization, higher speed, greater bandwidth, lower power consumption, and reduced latency have grown, a need has developed for improving semiconductor device component density. Stacked semiconductor devices, e.g., three-dimensional integrated circuits (3DICs), have been developed to reduce the physical size and two-dimensional footprint of semiconductor devices. In a stacked semiconductor device, active circuits (e.g., logic, memory, processor circuits, etc.) are fabricated on different semiconductor wafers. Two or more semiconductor wafers or dies may be mounted together through conventional techniques to increase device component density. Resulting stacked semiconductor devices generally provide smaller form factors with improved performance and lower power consumption.

BRIEF DESCRIPTION OF THE DRAWINGS

For a more complete understanding of representative embodiments, and the advantages thereof, reference is made to the following descriptions taken in conjunction with the accompanying drawings, in which:

FIGS. 4-9 are isometric, cross-sectional side-views illustrating various stages in the manufacture of a 3DIC device in accordance with a representative embodiment, wherein:

FIG. 4 is a side view (in cross-section along B-B, FIG. 1) illustrating backend of line (BEOL) processed wafer portion 10 as provided for further processing and hybrid bonding.

FIG. 5 is a side view (in cross-section along A-A, FIG. 1) illustrating BEOL processed wafer portion 10 as provided for further processing and hybrid bonding.

FIG. 6 is a cross-sectional side view of wafer portion 10 illustrating formation of redistribution via 600 and redistribution layer (RDL) 710, in accordance with a representative embodiment.

FIG. 7 is a cross-sectional side view of a first wafer 800 brought into alignment with a second wafer 800'.

FIG. 8 is a cross-sectional side view of first wafer 800 brought into contact with second wafer 800'.

FIG. 9 is a cross-sectional side view of first wafer 800 hybrid bonded to second wafer 800' to form hybrid bonded 3DIC device 1050.

Figure 1:
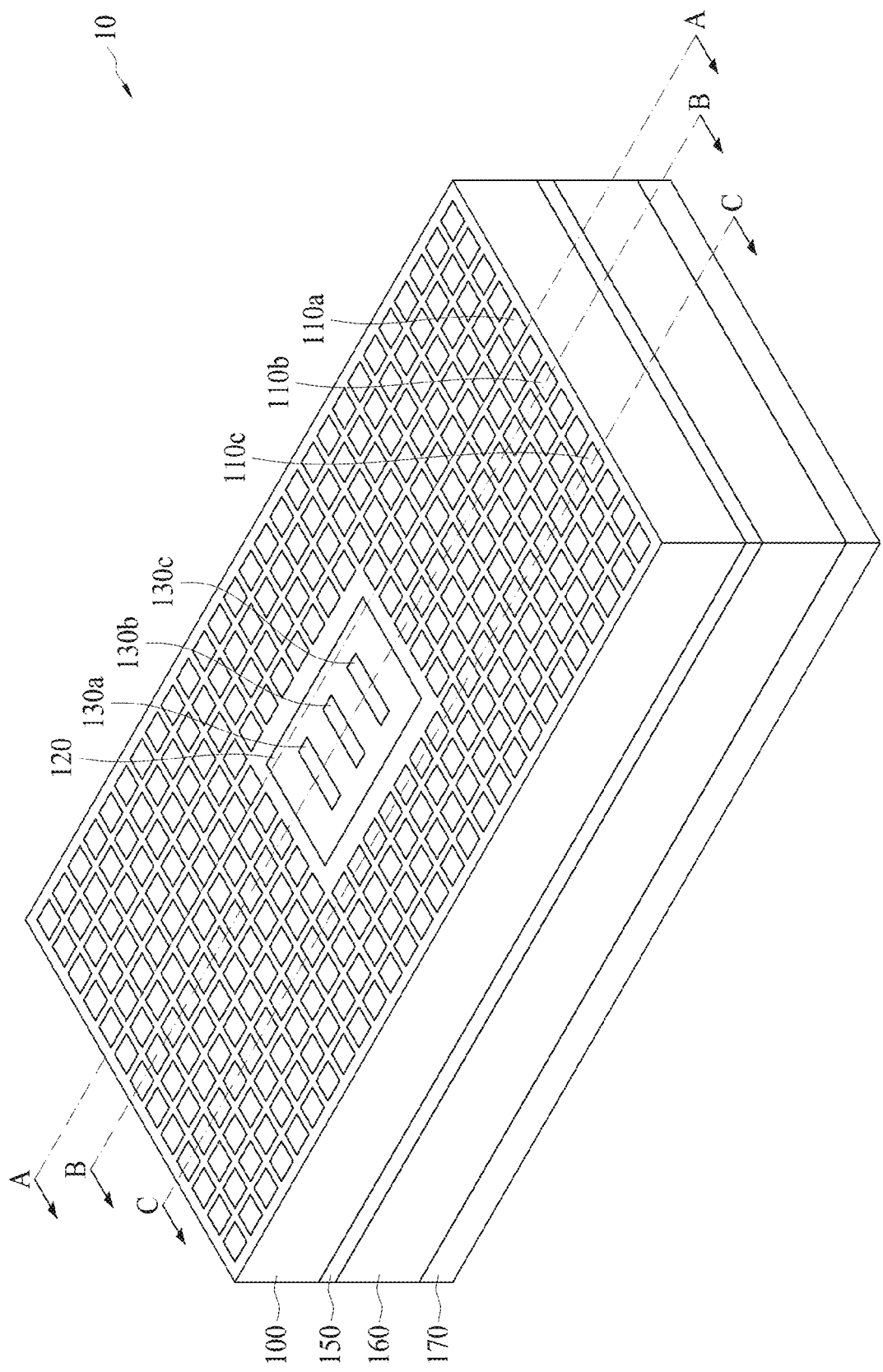
FIG. 1 is a perspective view of a portion of a wafer in accordance with a representative embodiment.

The drawings accompanying and forming part of this specification are included to representatively illustrate certain aspects of the disclosure. It should be noted that the features illustrated in the drawings are not necessarily drawn to scale.

DETAILED DESCRIPTION OF ILLUSTRATIVE EMBODIMENTS

The following disclosure provides various embodiments and representative examples. Specific examples of components and arrangements are described below to simplify the disclosure. These are merely examples and are not intended to be limiting. For example, the formation of a first feature over or on a second feature may include embodiments in which the first and second features are formed, e.g., in direct contact, and may also include embodiments in which additional features may be formed, e.g., between the first and second features, such that, e.g., the first and second features may not be in direct contact. The present disclosure may repeat reference numerals and/or letters in various examples. Such repetition is for the purpose of simplicity and clarity and does not in itself dictate a relationship between the various embodiments and/or configurations discussed. Additionally, the present disclosure may repeat a reference numeral followed by a prime designation, indicating that the element corresponding to the primed designation has a relationship to, or similar features as, an element bearing a corresponding un-primed designation; e.g., a first wafer 800 and a second wafer 800', or a first dummy metal pattern 300 and a second dummy metal pattern 300', or the like.

The semiconductor industry has experienced rapid growth with improvements in the integration density of various electronic components. Generally, improvement in integration density has come from reduction of minimum feature sizes, allowing for integration of more components into smaller form factors. These integration improvements have been primarily two-dimensional (2D) in nature, inasmuch as the region occupied by integrated components has generally been on the surface of semiconductor wafers. Although dramatic improvements in lithography have resulted in considerable improvements in 2D integrated circuit (IC) formation, there are physical limits to the density that may be achieved in two dimensions. One of these limits is the minimum size required to manufacture discrete components. When more devices are integrated in a chip, more complex designs are required. Three-dimensional ICs (3DICs) have therefore been developed to address some of these limitations. In representative manufacturing processes to produce 3DICs, two or more wafers, each including an IC, are formed. The wafers are then bonded with corresponding device elements aligned.

A problem associated with conventional approaches to 3DIC fabrication involves achieving a high level of planarity (i.e., minimization of local and global topographic differentials) such that an acceptable bond may be formed between wafers. If the planarity of the wafers is not within a prescribed specification, a non-bond area, "bubble," or other non-uniformity may result, causing devices formed in opposition to the bond region not to function. If the defect rate is high enough, the poorly bonded wafer assembly may be scrapped—thereby increasing manufacturing expense. A need exists to reduce manufacturing expense of 3DICs by improving wafer bond yield attendant to the fabrication of devices with good bond uniformity.

Figure 2A:
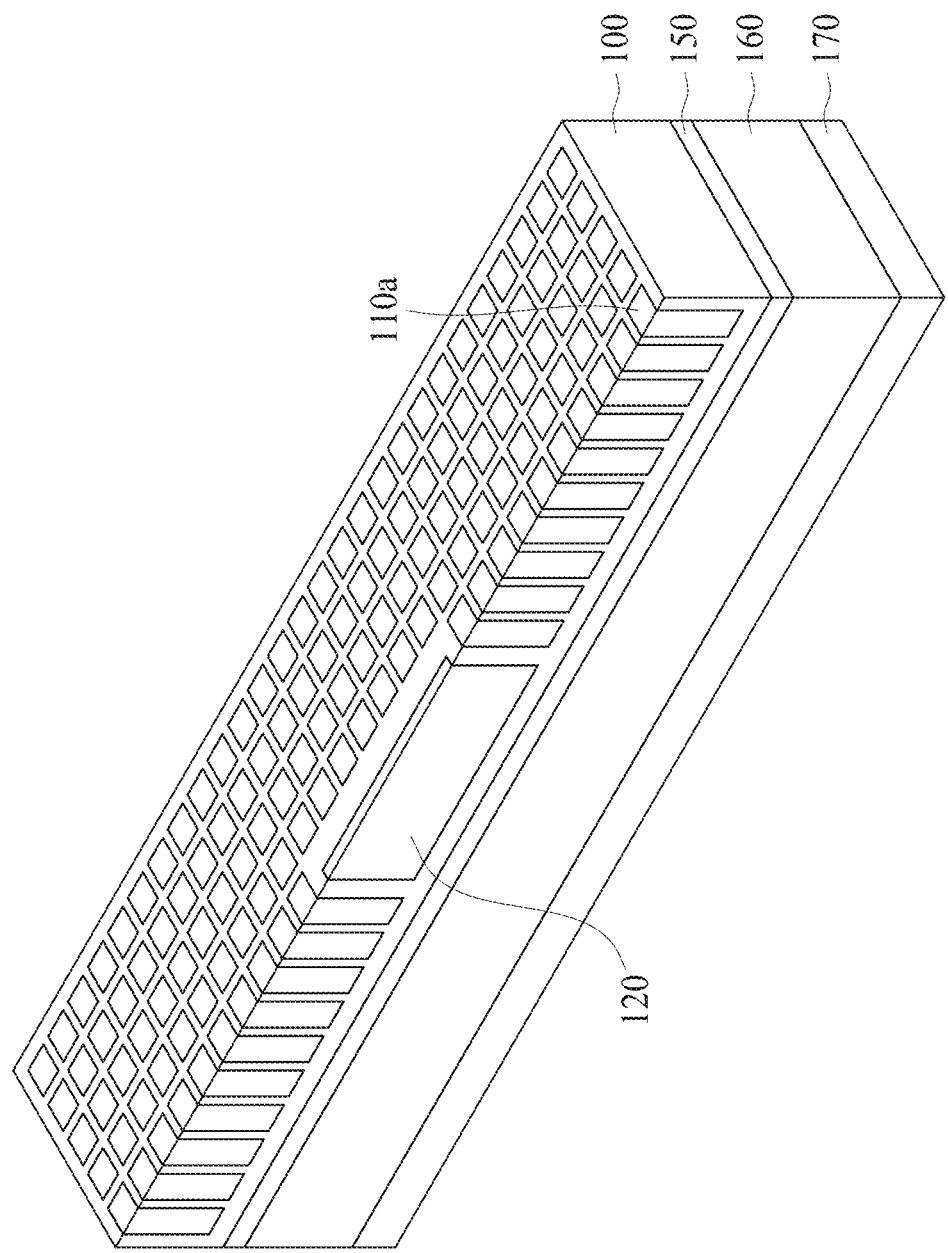
FIG. 2A is a perspective cut-away view (along the A-A cross-section) of the wafer portion representatively illustrated in FIG. 1.
Figure 2B:
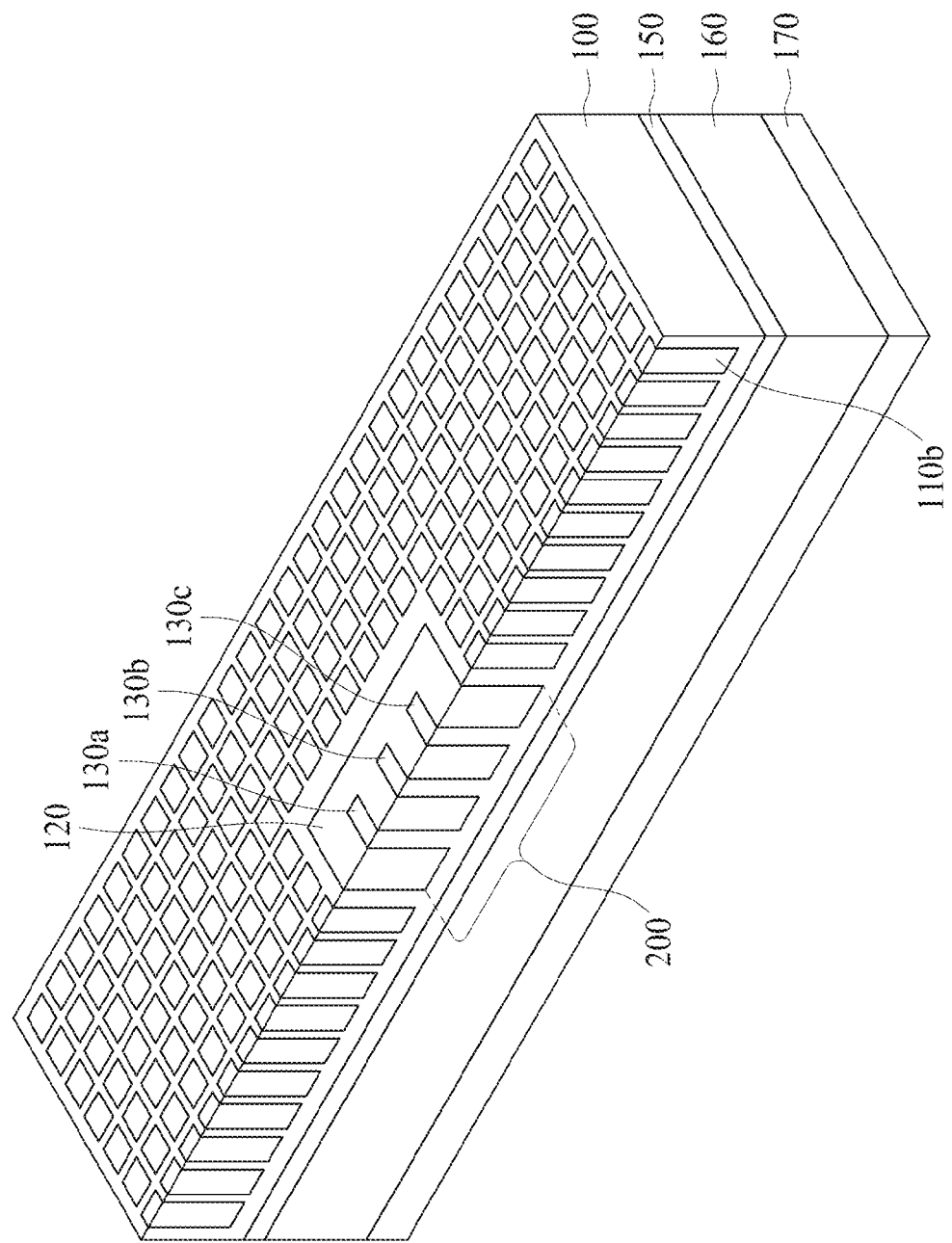
FIG. 2B is another perspective cut-away view (along the B-B cross-section) of the wafer portion representatively illustrated in FIG. 1.

FIG. 1 representatively illustrates a perspective view of a portion 10 of a wafer at a stage of fabrication subsequent to formation of top metal features during back-end of line (BEOL) processing. As representatively illustrated, wafer portion 10 may correspond to a die region of a first wafer. Wafer portion 10 typically has overlying active and/or passive structures (not illustrated for clarity of description, but discussed later herein). FIG. 1 indicates three cross-sections corresponding to various cutaway views of wafer portion 10: The A-A cross-section, corresponding to FIG. 2A; the B-B cross-section, corresponding to FIG. 2B; and the C-C cross-section, corresponding to FIG. 2C. Dummy metal feature 110a provides a point of reference for feature illustration in FIGS. 2A, 3A, and 5; dummy metal feature 110b provides a point of reference for feature illustration in FIGS. 2B, 3A, and 4; and dummy metal feature 110c provides a point of reference for feature illustration in FIGS. 2C and 3A. FIG. 3A representatively illustrates dummy metal features 110a, 110b, 110c as selected array elements of dummy metal pattern 300.

Figure 3A:
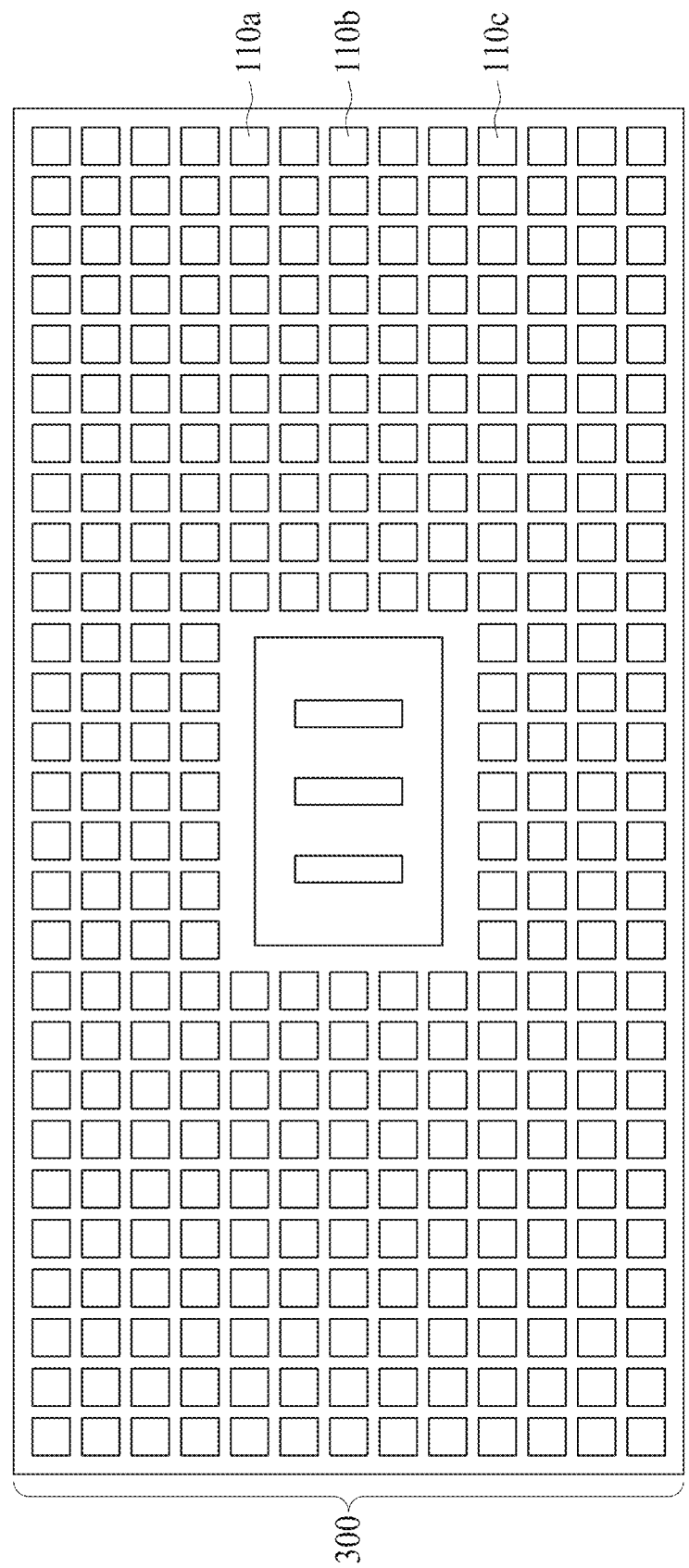
FIG. 3A is a top view of the wafer portion representatively illustrated in FIG. 1.
Figure 4:
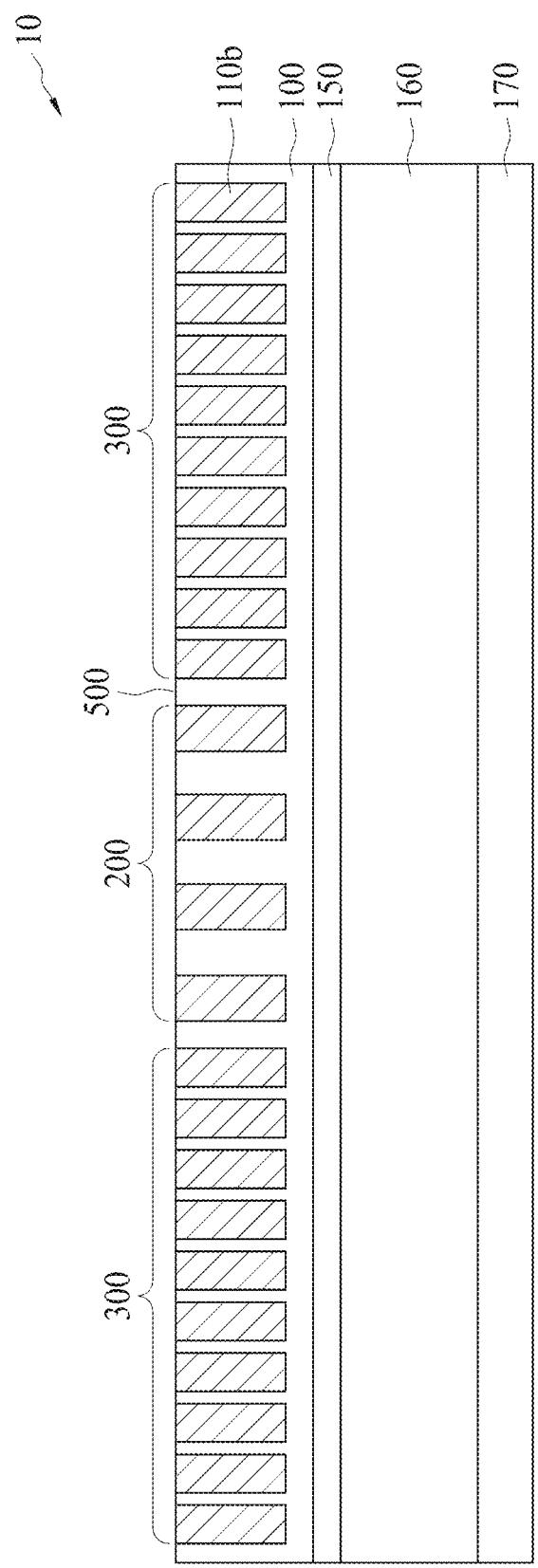
Figure 5:
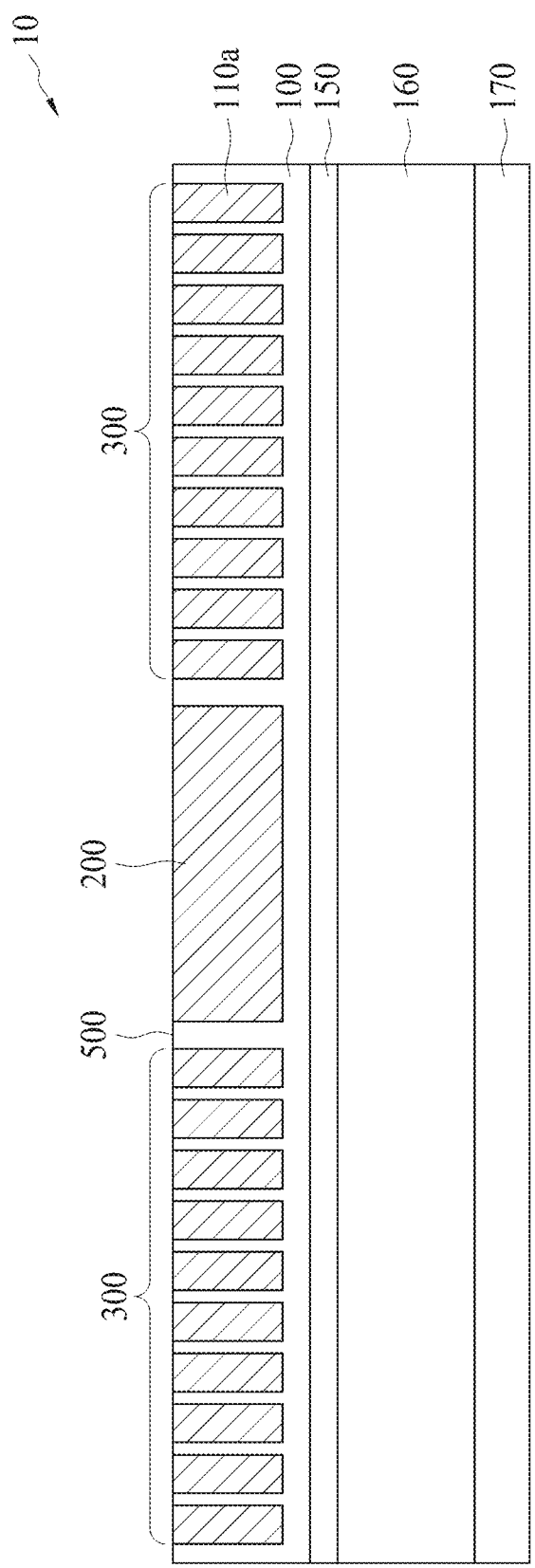
Figure 6:
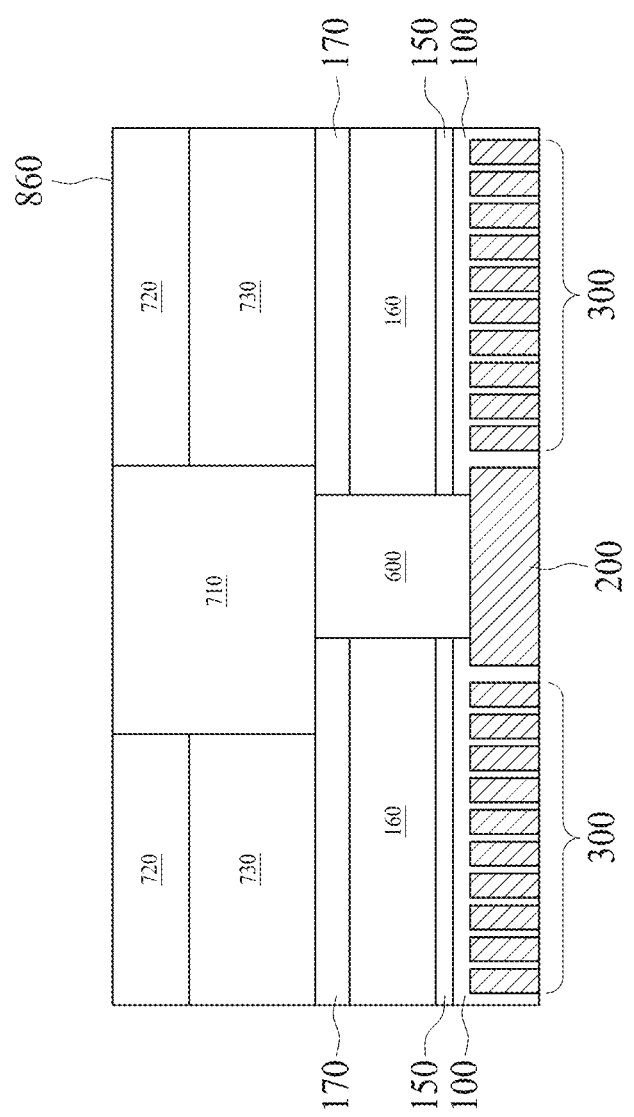

After forming BEOL top metal features, a first wafer and a second wafer may be further processed and subsequently hybrid bonded to each other to form 3DIC devices. During BEOL processing, BEOL metal (e.g., Cu, Al, W, Ti, TiN, Ta, TaN, AlCu, or the like) may be patterned to produce dummy metal pattern 300 (FIG. 3A) and metal pad 200 (FIGS. 2B, 4, 5). FIGS. 1, 2A-C, 3A, 4, and 5 show wafer portion 10 as supplied from a BEOL process to deposit and pattern top metal features. Methods of forming dummy metal features and metal pad features are known in the art. See, e.g., U.S. Pat. No. 8,753,971 entitled "Dummy Metal Design for Packaging Structures," filed on Mar. 22, 2012, hereby incorporated by reference in its entirety.

In a representative embodiment, metal pad 200 comprises a slotted pad 120 (a metal/conductive portion) with dielectric bars 130a, 130b, 130c between metal bars of slotted pad 120, as representatively illustrated, e.g., in FIGS. 1, 2A, 2B, 2C. Methods for fabricating slotted metal pad structures are known in the art and, for brevity, are not discussed further herein. See, e.g., U.S. Pat. No. 9,177,914 entitled "Metal Pad Structure Over TSV to Reduce Shorting of Upper Metal Layer," filed on Nov. 15, 2012, hereby incorporated by reference in its entirety.

Figure 3B:
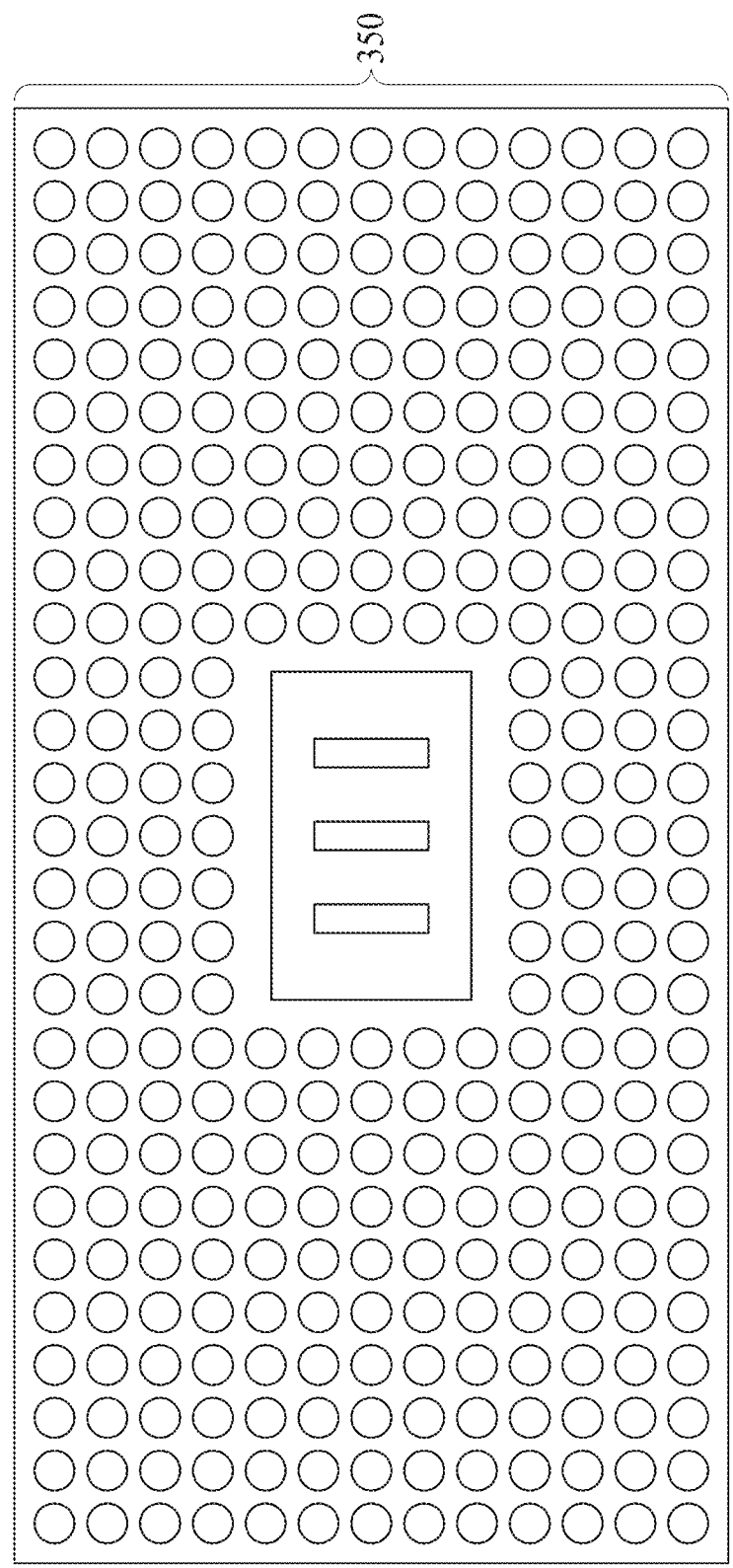
FIG. 3B is a top view of a wafer portion in accordance with another representative embodiment.

As representatively illustrated in FIG. 3, dummy metal pattern 300 may comprise a plurality of dummy metal features (e.g., 110a, 110b, 110c as representative elements of dummy metal pattern 300) arranged in an array. Dummy metal features are formed in recesses of insulating layer 100 during BEOL processing. In a representative embodiment, dummy metal pattern 300 may be formed substantially concurrent with formation of metal pad 200. In another representative embodiment, dummy metal pattern 300 may be formed of a same material (e.g., Cu, Al, W, Ti, TiN, Ta, TaN, AlCu, or the like) as that of conductive material comprising slotted pad 120. In an embodiment, the formation of dummy metal pattern 300 and metal pad 200 may include blanket depositing a metal layer, and then performing an etch, which may be a dry etch using $Cl_2$ and $BCl_3$ (e.g., chloride) as etchants. Dummy metal pattern 300 may not have electrical functions and may not be electrically connected to overlying active circuits. In alternative embodiments, additional dummy patterns may be formed, which may include dummy redistribution vias and/or dummy metal lines or pads. The formation of additional dummy patterns may improve adhesion or reduce stress by redistributing local stresses to larger regions of the wafer or chip. In other representative embodiments, dummy metal pattern 300 need not be arranged in a linear array, but may comprise a non-linear, curvilinear, Fibonacci, geometric sequence, or other uniform distribution of dummy metal feature elements. In still other representative embodiments, dummy metal pattern 300 need not be arranged in a uniform distribution, but may comprise a random or otherwise irregular distribution of dummy metal feature elements.

In one embodiment, the aggregate surface area of dummy metal pattern 300 (or the sum of the cross-sectional surface areas of the metal features comprising same) may be from about 40% to about 90% of the corresponding surface area of wafer portion 10. In another embodiment, the sum of the cross-sectional surface areas of the dummy metal features comprising dummy metal pattern 300 may be from about 50% to about 85% of the corresponding total surface area of dummy metal pattern 300. In yet another embodiment, the aggregate surface area of dummy metal pattern 300 may be about 80% of the corresponding surface area of wafer portion 10.

In a representative embodiment, a percentage of metal surface area of dummy metal pattern 300 relative to total surface area of dummy metal pattern 300 for a region is in a range from about 40% to about 90%. In another representative embodiment, a percentage of metal surface area of dummy metal pattern 300 relative to total surface areas of a wafer is less than about 50%. In another representative embodiment, a percentage of metal surface area of dummy metal pattern 300 relative to total surface area of a die is less than about 50%. In yet another representative embodiment, a ratio of total dummy metal surface area to total dielectric surface area is from about 1:10 to about 1:20. In still another representative embodiment, a ratio of total active metal surface area to total dummy metal surface area is from about 3:1 to about 10:1.

In accordance with representative embodiments, material forming dielectric bars 130a, 103b, 130c may comprise a same material (e.g., an electrically insulating or dielectric material, or the like) as that of insulating layer 100. For example, dielectric bars 130a, 103b, 130c and insulating layer 100 may comprise SiO$_2$. Other dielectric materials may be alternatively or conjunctively employed for dielectric bars 130a, 130b, 130c and insulating layer 100.

Dummy metal features (e.g., 110a, 110b, 110c) of dummy metal pattern 300 may comprise cross-sectional shapes corresponding to squares, as representatively illustrated, e.g., in FIGS. 1, 2A-2C, and 3A. Alternatively or conjunctively, other cross-sectional shapes may comprise circles (e.g., dummy metal field 350, as representatively illustrated in FIG. 3B), ellipses, ellipsoids, ovoids, regular polygons (e.g., equilateral triangles, regular pentagons, regular hexagons, stars, etc., including other regular polygons of any order of rotational symmetry greater than three), irregular polygons (e.g., isosceles triangles, scalene triangles, rectangles, trapezoids, rhomboids, etc., including other irregular polygons having any number of sides greater than three), and/or combinations thereof. It will be appreciated that any cross-sectional shape may generally be represented by superimpositions or discrete combinations of the aforementioned shapes. Accordingly, representative embodiments of dummy metal features disclosed herein are not limited to any particular cross-sectional shape. Additionally, dummy metal features of dummy metal pattern 300 may comprise aggregated, extended, connected, or otherwise patterned shapes; e.g., staggered bars, rings, perimeter bounding boxes, corrugated patterns, herringbone patterns, spiral patterns, or the like.

Figure 2C:
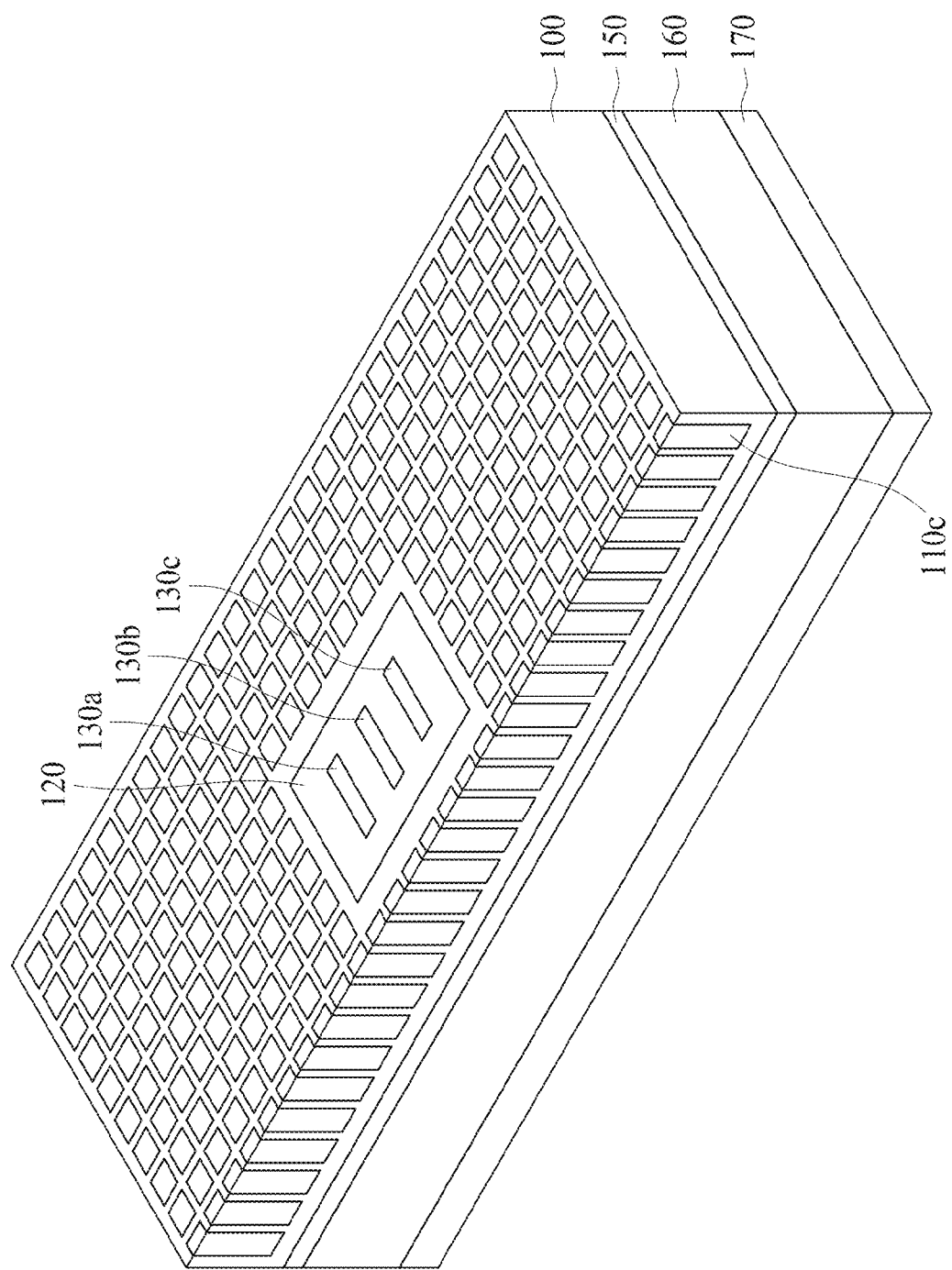
FIG. 2C is another perspective cut-away view (along the C-C cross-section) of the wafer portion representatively illustrated in FIG. 1.

A plurality of dummy metal features of wafer portion 10 may have a substantially continuous distribution along a given array coordinate or surface dimension; e.g., as shown for the dummy metal features (including dummy metal feature 110c) along the C-C cross-section illustrated in FIG. 1 and FIG. 2C. Other subsets of dummy metal features may have a discontinuous or otherwise interrupted distribution along a different array coordinate or surface dimension; e.g., as shown along: the A-A cross-section (including dummy metal feature 110a) as illustrated in FIG. 1, FIG. 2A, and FIG. 5; and the B-B cross-section (including dummy metal feature 110b) as illustrated in FIG. 1, FIG. 2B, and FIG. 4. Discontinuous or otherwise interrupted distributions in dummy metal pattern 300 may be suitably configured or otherwise adapted to provide an area or region for disposition of, e.g., interconnect structures (such as metal pad 200/slotted pad 120) to overlying active devices, or other device features.

As provide from BEOL processing, wafer portion 10 generally comprises various layers disposed under insulating layer 100. In a representative embodiment, a first SiN layer 150 is disposed under insulating layer 100, a first oxide layer 160 is disposed under first SiN layer 150, and a second SiN layer 170 is disposed under first oxide layer 160. It will be appreciated that various other layer configurations and/or material selections may be alternatively or conjunctively employed, and that the disclosed embodiments are not limited to the layer configurations and/or material selections recited herein—with the sole exception that insulating layer 100 generally comprises an electrically insulating or dielectric material such that dummy metal features of dummy metal pattern 300 are electrically isolated from one another and from active interconnect structures (e.g., metal pad 200/slotted pad 120, or the like).

Before BEOL processing to pattern top metal features, various processes may be employed to form a variety of microelectronic device elements (not illustrated in the Figures) over dummy metal pattern 300 and metal pad 200. In accordance with various representative embodiments, and as will be appreciated by persons skilled in the art, wafer portion 10 may be supplied from BEOL processing with microelectronic elements or other device components so disposed.

Figure 10:
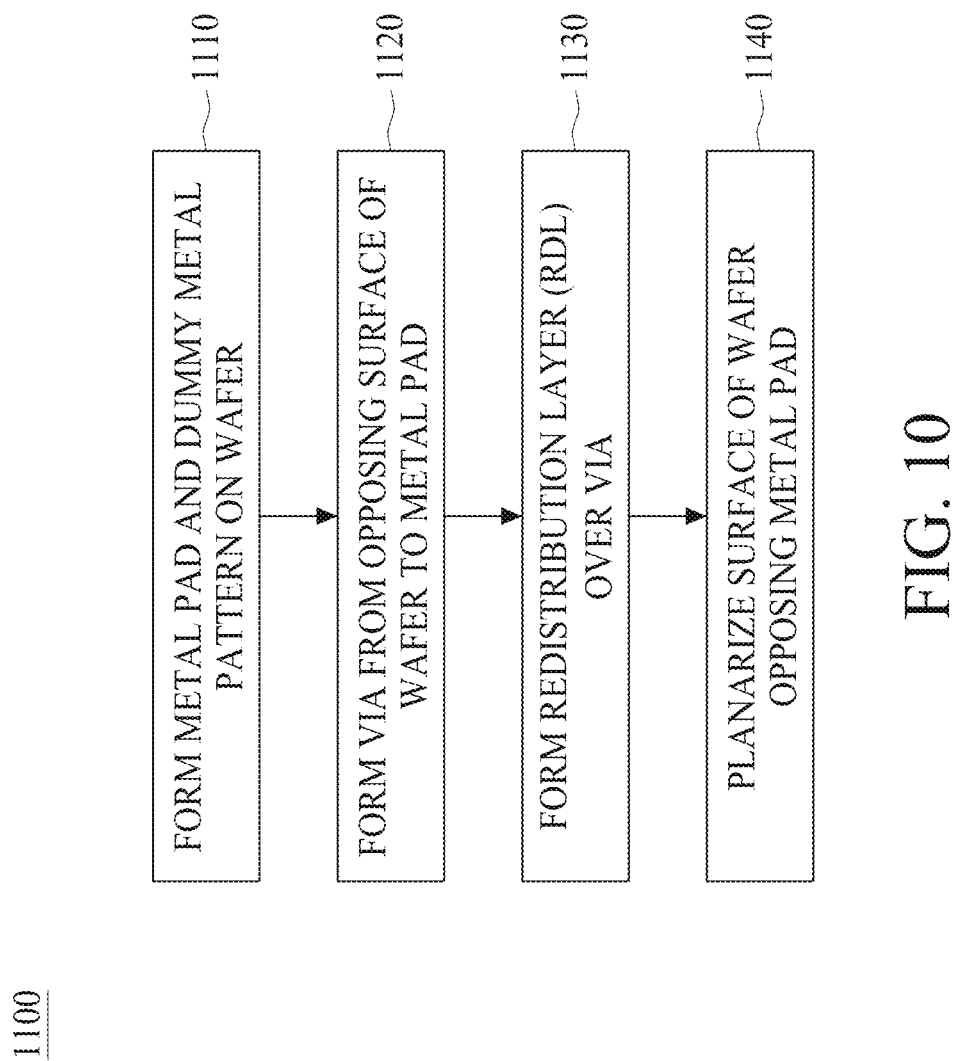
FIG. 10 is a flowchart for a method of preparing a wafer for hybrid bonding, in accordance with a representative embodiment.

In accordance with a representative embodiment illustrated in FIG. 10, a method 1100 begins by forming 1110 a metal pad 200 and dummy metal pattern 300 in a wafer during BEOL processing. As supplied from BEOL processing, and as representatively illustrated in FIG. 5, dummy metal pattern 300 is recessed within (and has a top surface coplanar with surface 500 of) insulating layer 100. Slotted pad 120 is recessed within (and has a top surface coplanar with surface 500 of) insulating layer 100. In a representative embodiment, dielectric bars 130a, 103b, 130c comprise portions of insulating layer 100 remaining after slotted pad 120 is formed therein. Metal pad 200 comprises dielectric bars 130a, 130b, 130c and slotted pad 120.

In accordance with a representative embodiment, a second oxide layer 730 is deposited over second SiN layer 170, and a dielectric layer 720 is deposited over second oxide layer 730. Second oxide layer 730 may be deposited by a high-density plasma chemical vapor deposition (HDP-CVD), e.g., using silane (SiH$_4$) and oxygen (O$_2$) as precursors, or a flowable CVD (FCVD) (e.g., a CVD-based material deposition in a remote plasma system with post curing to convert to another material), and/or the like. Dielectric layer 720 may be deposited using any suitable method, such as, atomic layer deposition (ALD), chemical vapor deposition (CVD), HDP-CVD, physical vapor deposition (PVD), and/or the like. In a representative embodiment, dielectric layer 720 may comprise SiON; however, any suitable dielectric material (e.g., SiN) may be alternatively or conjunctively used.

Method 1100 continues with formation 1120 of redistribution via 600 and formation 1130 of redistribution layer (RDL) 710. A first etch process forms a redistribution via opening in dielectric layer 720, second oxide layer 730, second SiN layer 170, and first oxide layer 160 down to first SiN layer 150 (e.g., a first etch stop). The first etch may be any acceptable etch process, such as reactive ion etch (RIE), neutral beam etch (NBE), wet etching, and/or the like. Photoresist used to define the first etch region may be removed by ashing and/or wet strip processes. In some embodiments, a hard mask may be formed over dielectric layer 720 prior to deposition of photoresist, in which case the pattern from development of the photoresist would be transferred to the hard mask, and the patterned hard mask would be used to etch underlying layers 720, 730, 170, 160.

A second etch process forms a redistribution layer opening in dielectric layer 720 and second oxide layer 730 down to second SiN layer 170 (e.g., a second etch stop). In a representative embodiment, the redistribution layer opening may be disposed within and is wider than the redistribution via opening. The second etch may be any acceptable etch process, such as reactive ion etch (RIE), neutral beam etch (NBE), wet etching, and/or the like. Photoresist used to define the second etch region may be removed in an ashing and/or wet strip process. In some embodiments, a hard mask may be formed over dielectric layer 720 prior to deposition of photoresist, in which case the pattern would be transferred to the hard mask, and the patterned hard mask would be used for etching underlying layers 720, 730, 170, 160 in the redistribution layer opening, and layers 150 and 100 down to contact pad 200 in the redistribution via opening.

The redistribution via opening and redistribution layer opening may be filled with a conductive material (e.g., a metal, a metal alloy, Cu, Al, W, Ti, TiN, Ta, TaN, AlCu, and/or the like) to form redistribution via 600 and RDL 710, respectively. Conductive material comprising redistribution via 600 is in electrical contact with metal pad 200. Conductive material comprising RDL 710 is in electrical contact with redistribution via 600, which is in electrical contact with metal pad 200. Accordingly, RDL 710 is in electrical contact with slotted pad 120/metal pad 200. An intermediate planarization may be performed, e.g., with CMP, to remove mask material or to otherwise condition the exposed surfaces of dielectric layer 720 and RDL 710 for subsequent pre-hybrid-bond planarization.

Although the immediately preceding embodiment describes formation of a single-layer RDL, it will be appreciated that various modifications (e.g., sequenced plural application of masking, etching, filling, intermediate planarization, and/or like methods) may be made to the disclosed procedure in order to produce a multilayer RDL having any number of interconnect levels. Accordingly, the embodiments disclosed herein are not limited to implementation with an RDL having only one layer.

Thereafter the top surfaces of dielectric layer 720 and RDL 710 opposing metal pad 200 are planarized 1140 to produce planarized surface 860 presented for subsequent hybrid bonding. Planarization 1140 may be performed by non-selective CMP or selective CMP. In accordance with a representative embodiment, dielectric layer 720 may serve as a polishing stop or planarization stop layer.

It has been observed that when a percentage of metal surface area of dummy metal pattern 300 to a total surface area of dummy metal pattern 300 is in a range from about 40% to about 90%, in conjunction with a percentage of metal surface area of metal pad 200 to a total surface area of metal pad 200 in a range from about 50% to about 90%, improved planarization of surface 860 of dielectric layer 720 and RDL 710 may be achieved.

Figure 7:
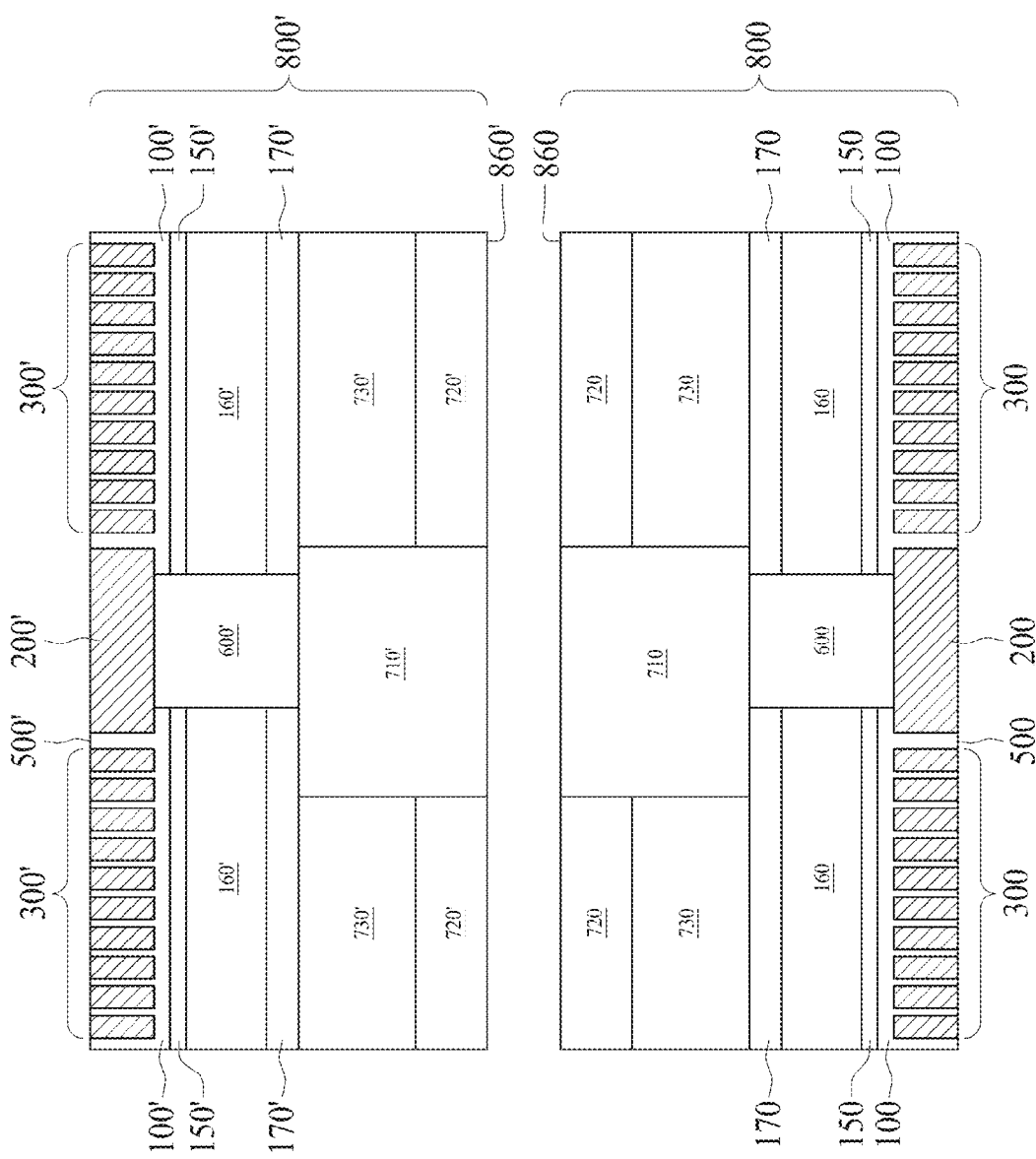
Figure 11:
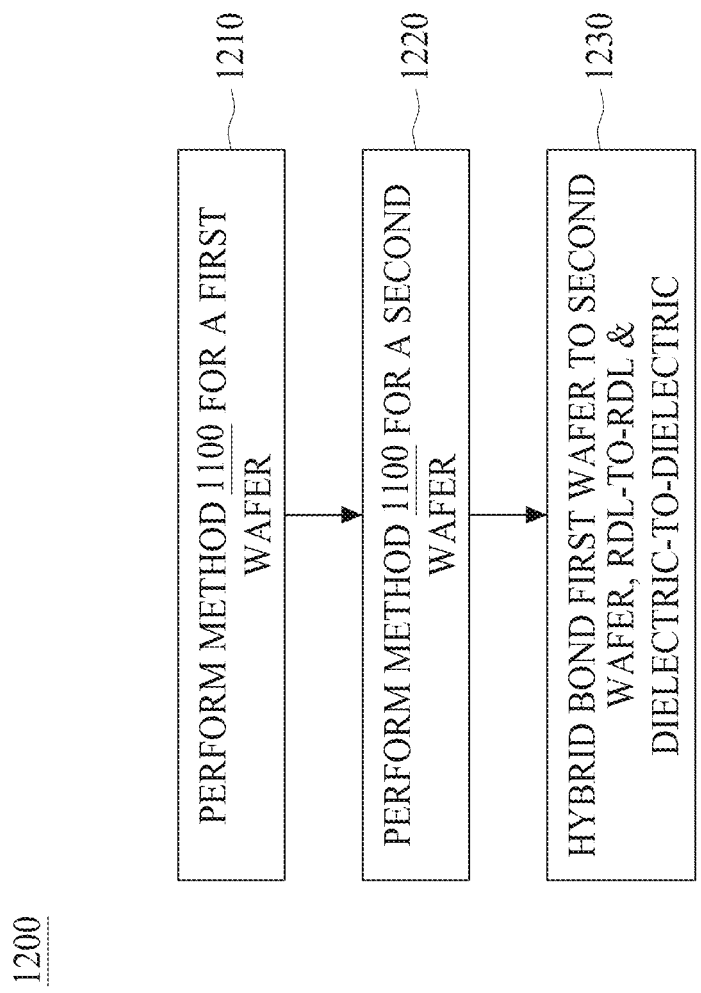
FIG. 11 is a flowchart for a method of hybrid bonding first and second wafers, in accordance with a representative embodiment.

As representatively illustrated in FIG. 11, a method 1200 of forming a 3DIC device comprises performing 1210 method 1100 to planarize a first wafer 800, and performing 1220 method 1100 to planarize a second wafer 800'. As representatively illustrated in FIG. 7, the planarized surface 860 of the first wafer 800 and the planarized surface 860' of the second wafer 800' are thereafter brought into alignment, such that dielectric areas (e.g., corresponding to dielectric layer 720') of the second wafer 800' are over dielectric areas (e.g., dielectric layer 720) of the first wafer 800, and RDL 710' of the second wafer 800' is over RDL 710 of the first wafer.

Figure 8:
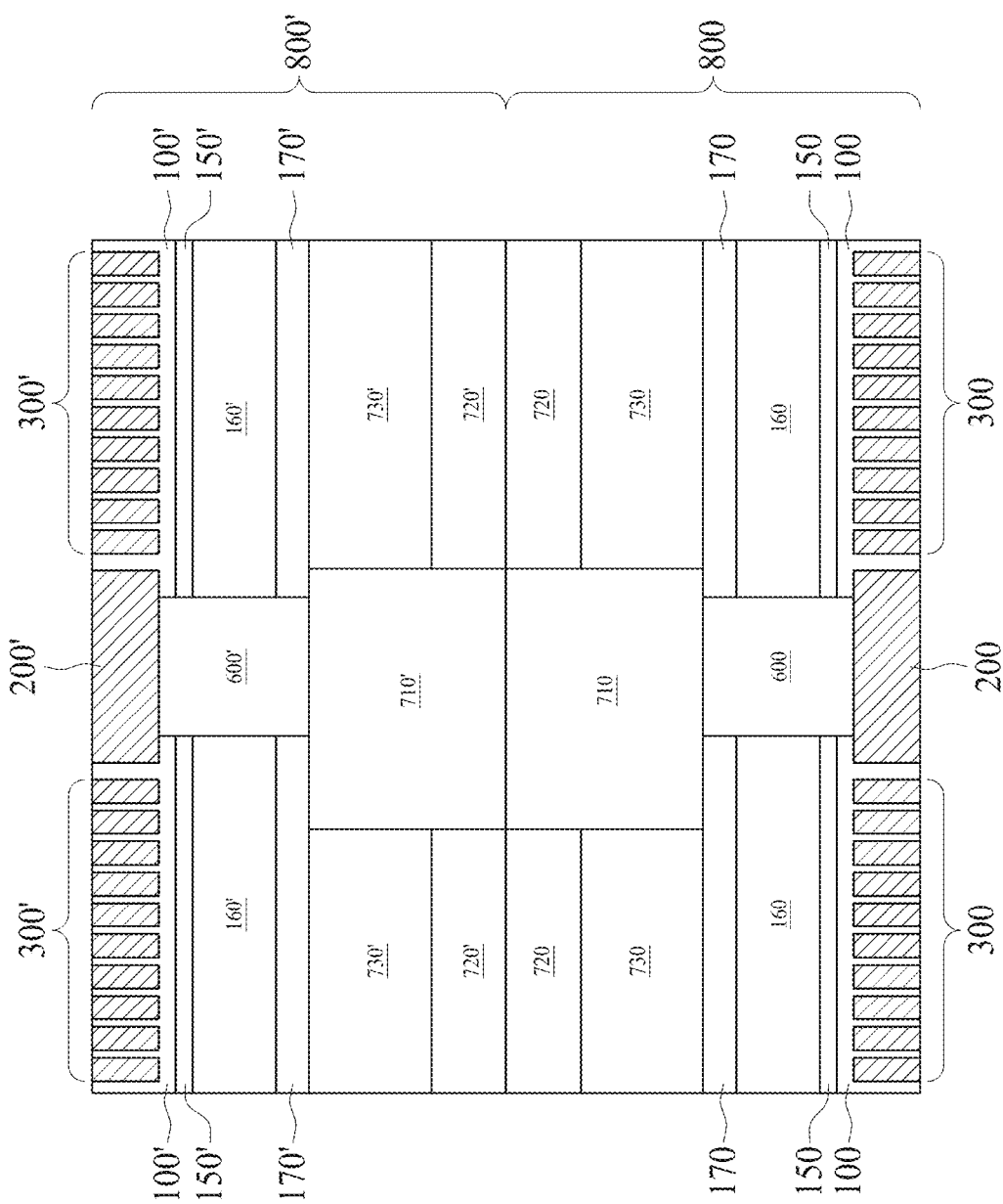

As representatively shown in FIG. 8, planarized surface 860 of the first wafer 800 and planarized surface 860' of the second wafer are brought into contact with each other while maintaining relative alignment. Before the wafers 800 and 800' are coupled together, the top surfaces of the first wafer 800 and the second wafer 800' may be activated in some embodiments, e.g., after removing a sealing layer from over dielectric layers 720 and 720'. Activating the top surfaces of the first wafer 800 and the second wafer 800' may comprise a dry treatment, a wet treatment, a plasma treatment, exposure to an inert gas, exposure to $H_2$, exposure to $N_2$, exposure to $O_2$, or combinations thereof, as examples. In embodiments where a wet treatment is used, an RCA cleaning may be used, for example. Alternatively, the activation process may comprise other types of treatments. The activation process assists in the hybrid bonding of the first wafer 800 and the second wafer 800'; advantageously allowing the use of lower pressures and temperatures in subsequent hybrid bonding processes. After the activation process, the wafers 800 and 800' may be cleaned using a chemical rinse. There is little or no change in surface roughness of wafers 800 and 800' after the activation process in accordance with representative embodiments; e.g., having a root mean square (RMS) difference of less than about 5 Å, as an example. The wafer assembly is then subjected to thermal treatment and contact pressure to hybrid bond 1230 the first wafer 800 to the second wafer 800'. Wafers 800 and 800' may be subjected to a pressure of about 200 kPa or less, and a temperature between about 200° C. and about 400° C. to fuse corresponding dielectric layers. The dielectric layers corresponding to dielectric layer 720 of the first wafer 800 and dielectric layer 720' of the second wafer 800' are fused to form composite dielectric layer 1010. Wafers 800 and 800' may then be subjected to a temperature at or above the eutectic point for material of RDLs 710 and 710', e.g., between about 150° C. and about 650° C., to fuse the metal layers. The metal layers corresponding to RDL 710 of the first wafer and RDL 710' of the second wafer 800' are fused to form composite RDL 1000. In this manner, fusion of the first wafer 800 to the second wafer 800' forms hybrid bonded 3DIC device 1050. For a more detailed discussion of hybrid bonding processes, see U.S. Pat. No. 8,809,123 entitled "Three Dimensional Integrated Circuit Structures and Hybrid Bonding Methods for Semiconductor Wafers," filed on Jun. 5, 2012, and U.S. Pat. No. 9,048,283 entitled "Hybrid Bonding Systems and Methods for Semiconductor Wafers," filed on Jul. 5, 2012, both of which are incorporated herein by reference in their entireties.

Figure 12:
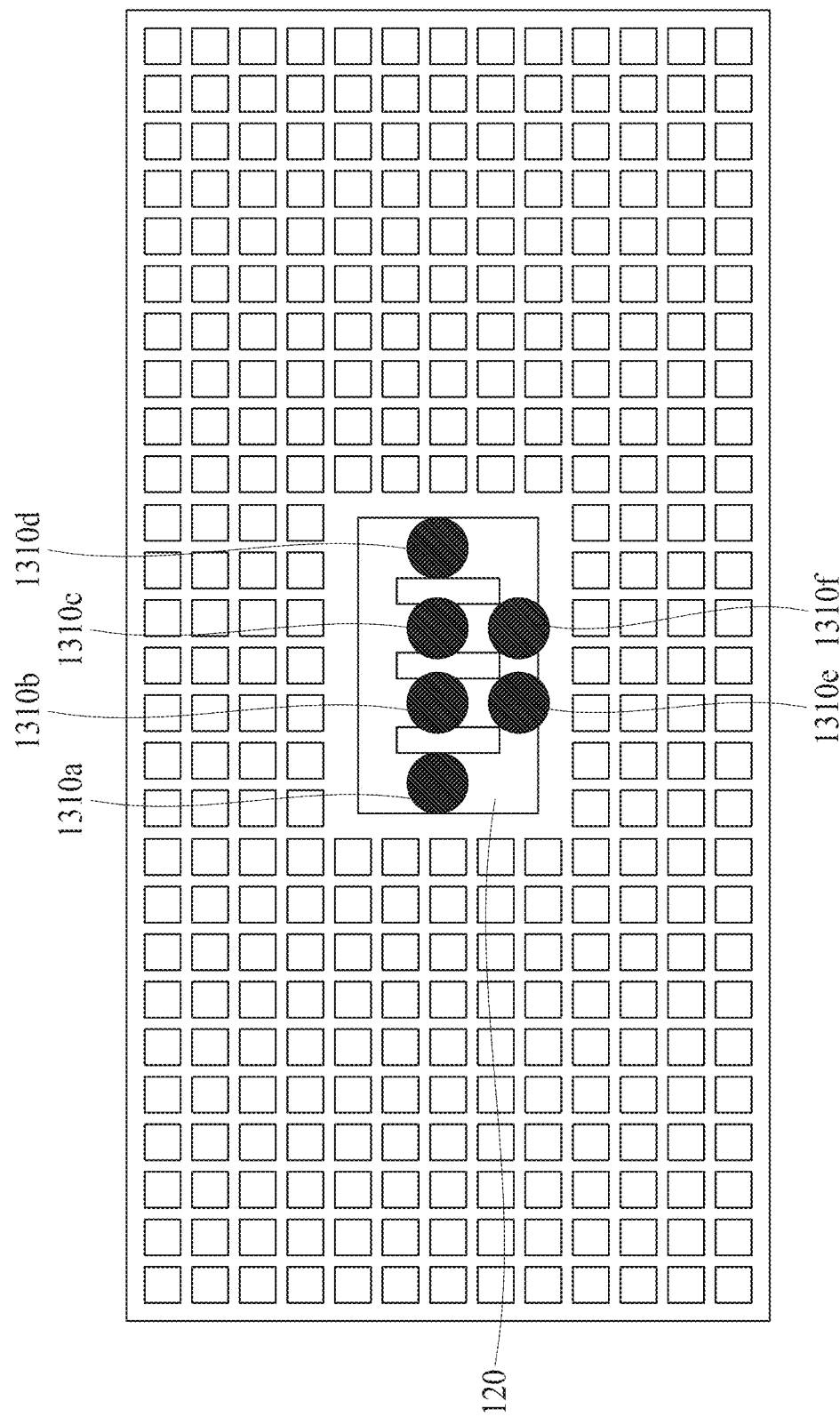
FIG. 12 illustrates RDL landing regions in accordance with a representative embodiment.

FIG. 12 illustrates representative RDL landing regions 1310a, 1310b, 1310c, 1310d, 1310e, 1310f for contacting portions of slotted pad 120, in accordance with an embodiment. It will be appreciated, however, that various other configurations or geometries may be alternatively or conjunctively employed for landing RDL elements on slotted pad 120. Accordingly, embodiments disclosed herein are not limited to any specific RDL landing configuration or geometry, provided that active RDL elements are at least in electrical contact with one or more slotted pad 120 portions of metal pad 200. The slotted pad 120 of metal pad 200 described above is merely an example. Other designs of slotted metal pads may be alternatively or conjunctively used. See, e.g., U.S. Pat. No. 9,177,914 entitled "Metal Pad Structure Over TSV to Reduce Shorting of Upper Metal Layer."

Figure 13A:
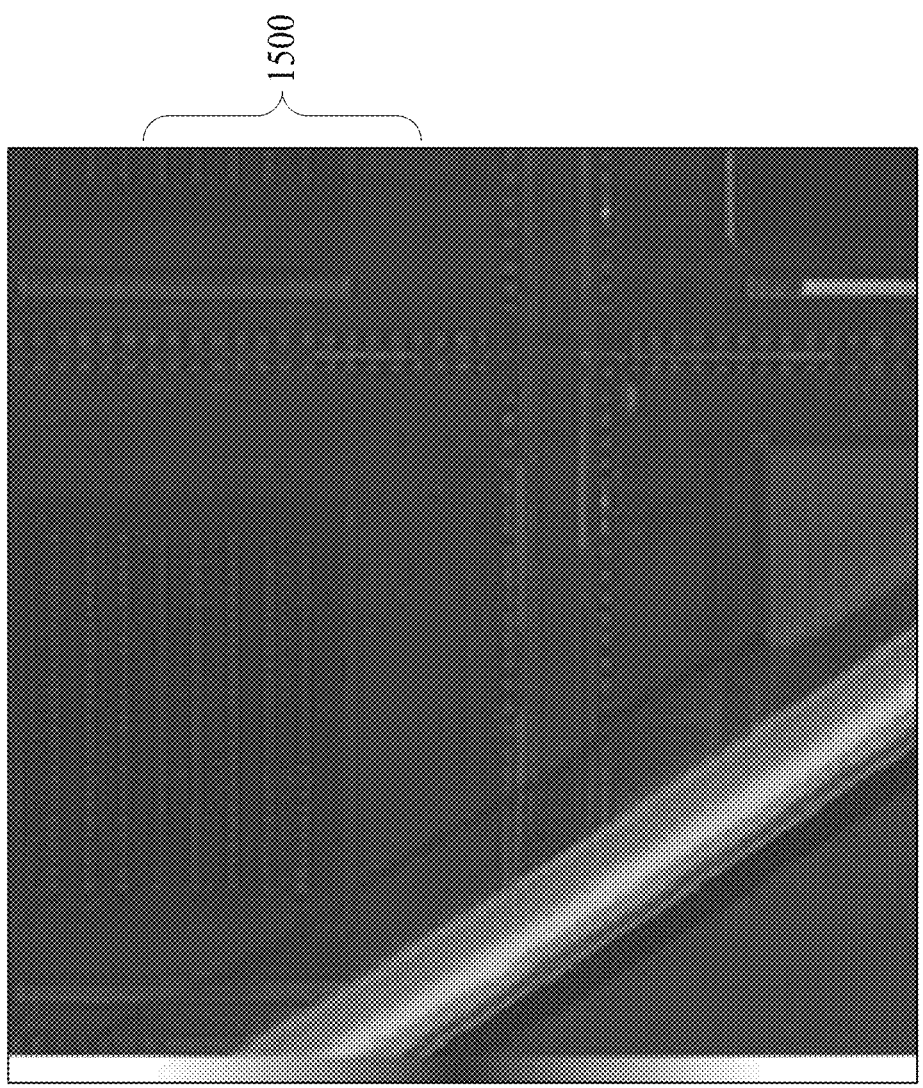
FIG. 13A is a confocal scanning acoustic microscopy (C-SAM) image taken after hybrid bonding two wafers in accordance with a representative embodiment.
Figure 14A:
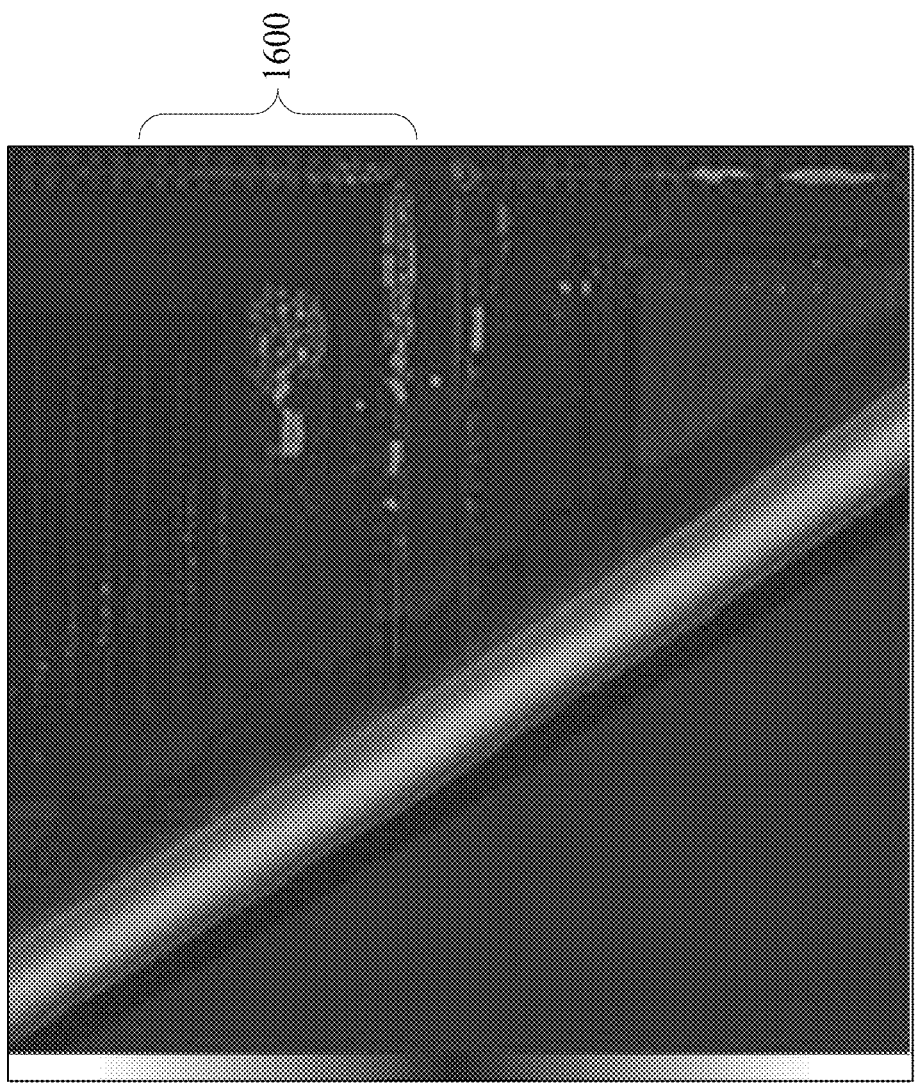
FIG. 14A is a C-SAM image, in accordance with conventional 3DIC fabrication techniques.

FIG. 13A depicts a confocal scanning acoustic microscopy (C-SAM) image taken after hybrid bonding 1230 two wafers 800, 800' in accordance with a representative embodiment. FIG. 14A depicts a C-SAM image, in accordance with a conventional 3DIC fabrication method. The conventional fabrication method shows a substantial bond non-uniformity 1600, compared with good bonding uniformity 1500 for a 3DIC fabrication method 1100, 1200 in accordance with a representative embodiment.

Figure 13B:
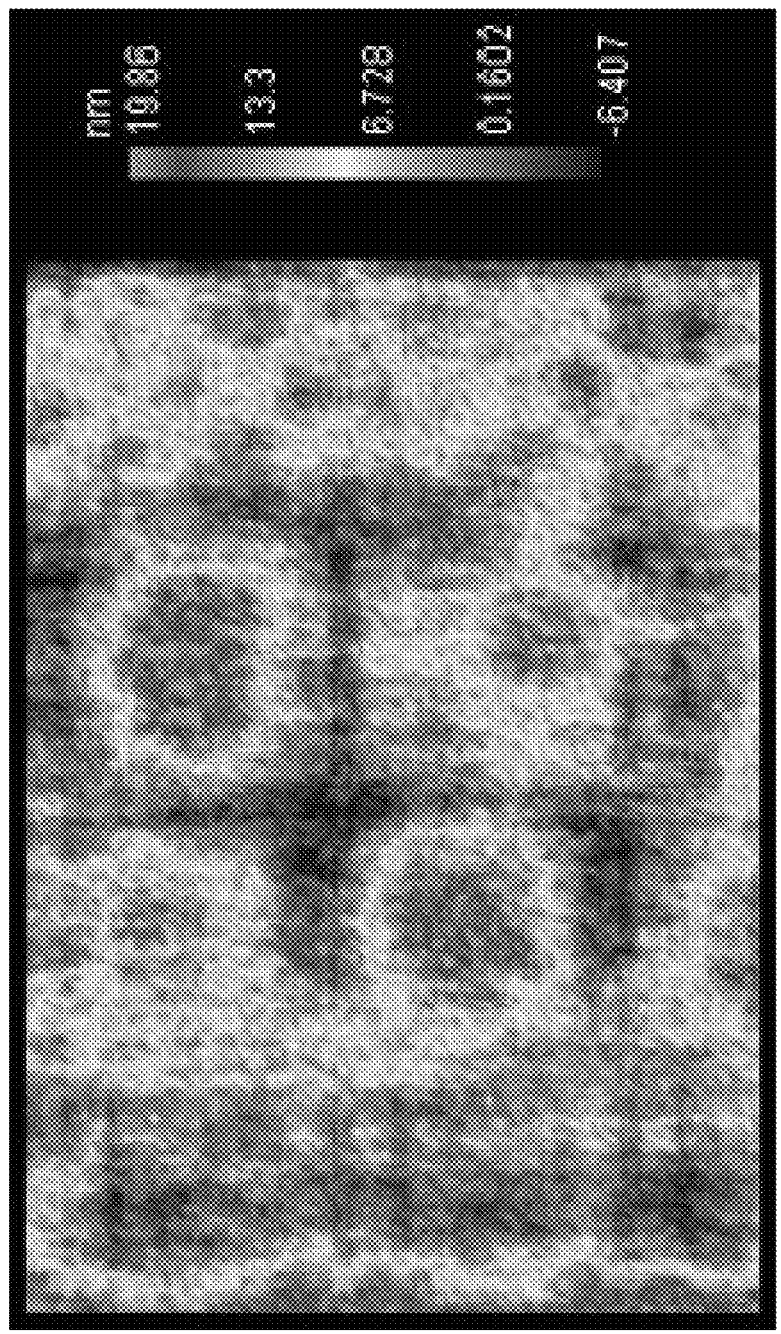
FIG. 13B is a BEOL two-dimensional (2D) topography profile image of a planarized wafer prior to hybrid bonding in accordance with a representative embodiment.
Figure 14B:
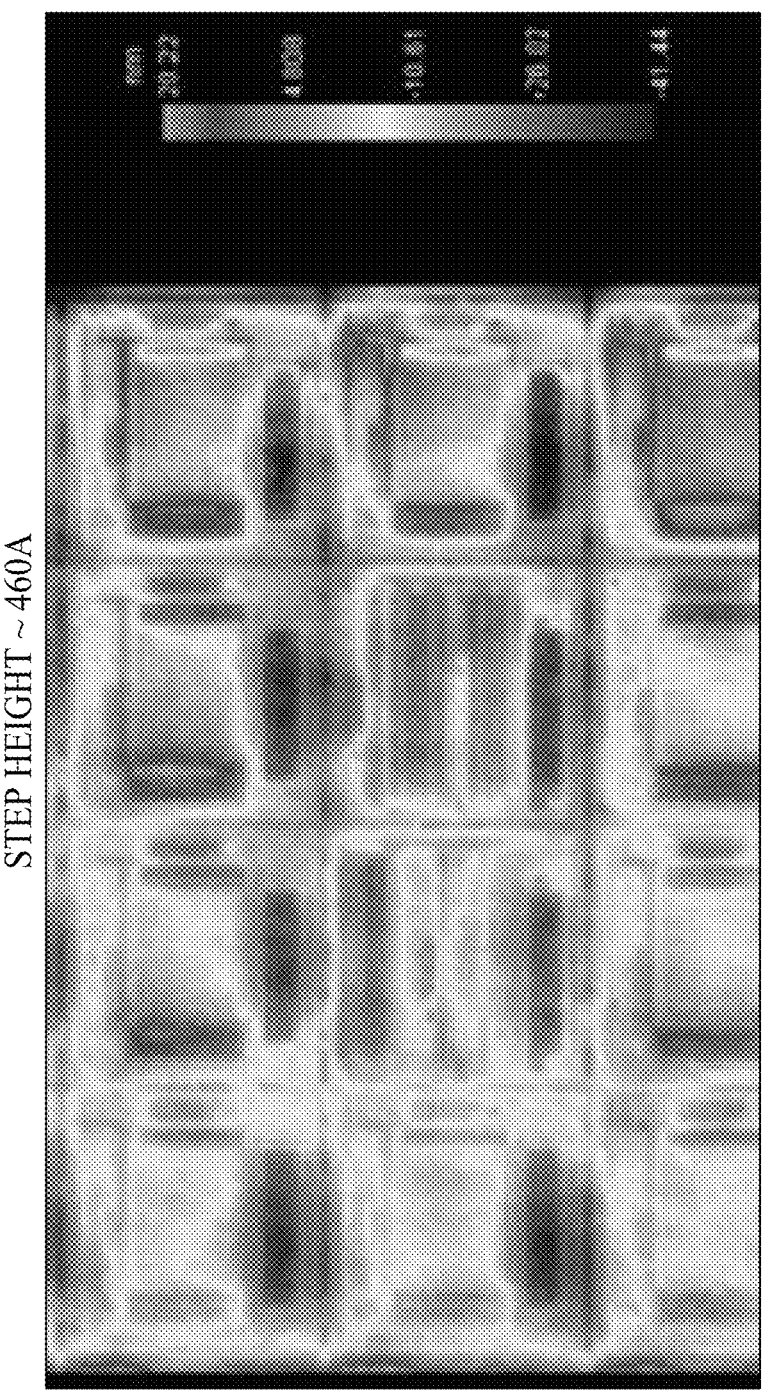
FIG. 14B is a BEOL 2D topography profile image of a planarized wafer prior to 3DIC bonding in accordance with conventional fabrication techniques.

FIG. 13B depicts a BEOL 2D topography profile image of a planarized wafer prior to hybrid bonding in accordance with a representative embodiment. FIG. 14B depicts a BEOL 2D topography profile image of a planarized wafer prior to bonding in accordance with conventional fabrication techniques. The conventional planarization method shows a substantial step height of about 460 Å, while a planarization method 1100 in accordance with a representative embodiment provides a much reduced step height of about 263 Å. Step heights in excess of 400 Å are associated with poor bonding uniformity. In accordance with representative embodiments, BEOL lithography controls utilizing a wafer edge exclusion (WEE) of 1±0.5 mm may be conjunctively employed to further promote topographic uniformity at the wafer's edge.

Notwithstanding the representative embodiments illustrated in FIGS. 6-9 and 11, it will be appreciated that other representative embodiments may employ dummy metal pattern 300 and slotted pad 120 configurations described herein for a single wafer presented for subsequent hybrid bonding to another wafer not having dummy metal pattern 300 and/or slotted pad 120 configurations as described herein. In such circumstances, employing method 1100 to planarize a single wafer of a wafer pair intended for subsequent hybrid bonding may be sufficient to produce acceptable bond uniformity for 3DIC devices formed thereby.

Prior to BEOL processing, various processes may be employed to form a variety of microelectronic elements overlying dummy metal pattern 300 and metal pad 200, including: deposition, etching, implantation, photolithography, annealing, and/or other suitable processes. Microelectronic elements formed thereby may be interconnected to produce a variety of IC devices, such as, e.g., logic, random access memory (RAM), radio frequency (RF), digital signal processing (DSP), input/output (I/O), system-on-chip (SoC), application-specific IC (ASIC), application-specific standard product (ASSP), field-programmable gate array (FPGA), image sensor, micro-electro-mechanical system (MEMS), and/or like devices. Such devices may include various passive and active components, such as, e.g., resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or the like. Such devices, device elements, and associated structure have been omitted from illustration in the Figures for clarity of description of representative embodiments.

Figure 9:
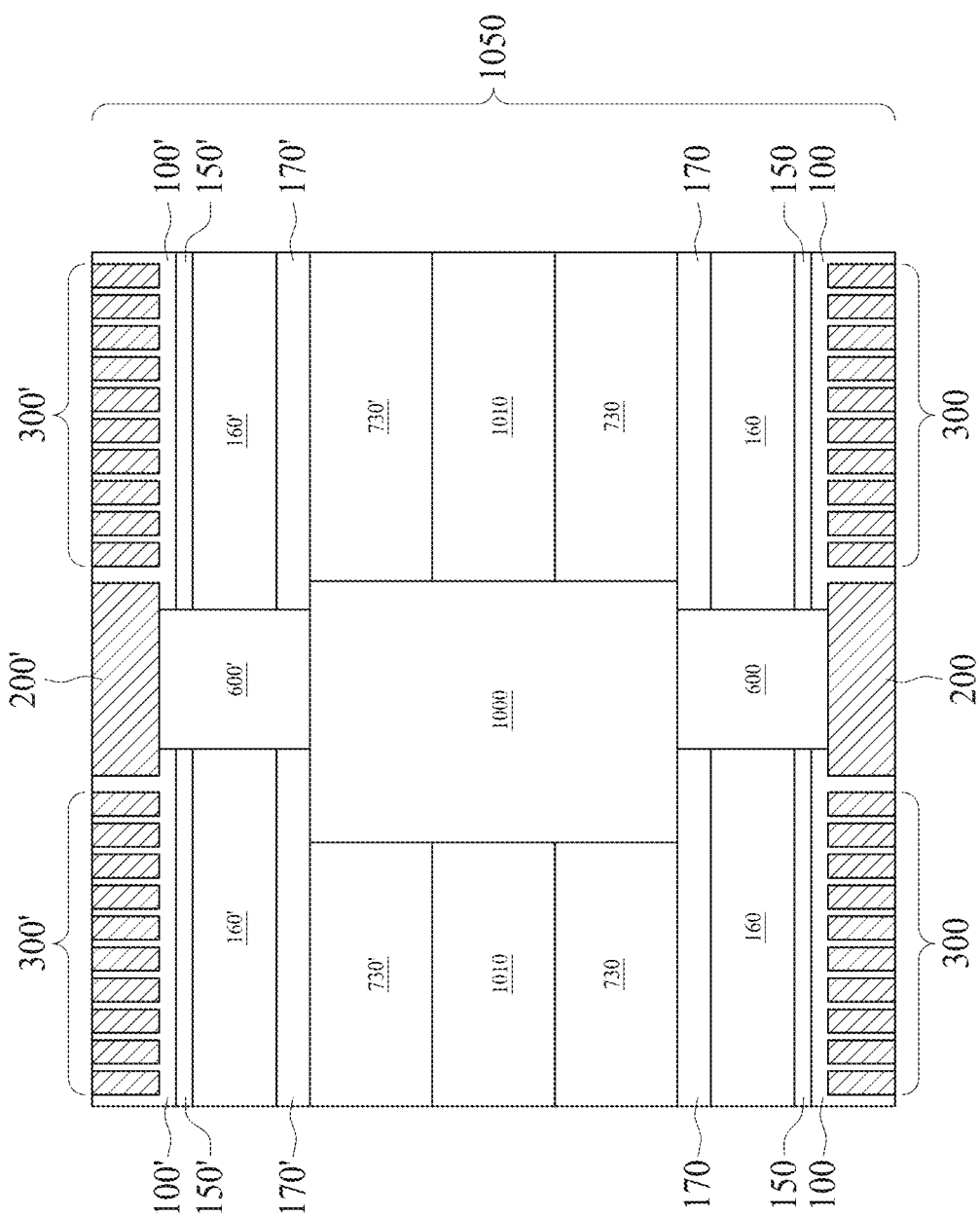

By way of example, in accordance with a representative embodiment, a backside illuminated (BSI) CMOS image sensor device underlies dummy metal pattern 300 and metal pad 200 of a first wafer 800 that may be subsequently hybrid bonded to a second wafer 800' having an ASIC device underling dummy metal pattern 300' and metal pad 200' (as may be extrapolated from representative and generalized illustration in FIG. 8) to form, e.g., a 3DIC BSI CMOS image sensor/processor (as may be extrapolated from representative and generalized illustration in FIG. 9). By way of further example, in accordance with another representative embodiment, an FPGA device underlies dummy metal pattern 300 and metal pad 200 of a first wafer 800 that may be subsequently hybrid bonded to a second wafer 800' having a MEMS accelerometer device underlying dummy metal pattern 300' and metal pad 200' (as may be extrapolated from representative and generalized illustration in FIG. 8) to form, e.g., a 3DIC programmable inertial guidance device (as may be extrapolated from representative and generalized illustration in FIG. 9). Accordingly, it will be appreciated that embodiments disclosed herein are not limited to any particular active structure or device element, whether now known or hereafter derived, that may be disposed on or under dummy metal patterns 300, 300' and metal pads 200/200'.

In accordance with a representative embodiment, a method for bonding wafers includes the steps of: providing a first wafer having a first dummy metal pattern disposed within and on a first surface of the first wafer, the first wafer having a second surface opposing the first surface, a percentage of metal surface area of the first dummy metal pattern relative to a total surface area of the first dummy metal pattern in a first range from about 40% to about 90%; providing a second wafer having a second dummy metal pattern disposed within and on a third surface of the second wafer, the second wafer having a fourth surface opposing the third surface, a percentage of metal surface area of the second dummy metal pattern relative to a total surface area of the second dummy metal pattern in a second range from about 40% to about 90%; planarizing the second surface of the first wafer; planarizing the fourth surface of the second wafer; and hybrid bonding the fourth surface to the second surface.

In one embodiment, a method for bonding semiconductor wafers includes the steps of: providing a first semiconductor wafer with a first conductive pad disposed within a first insulating material and on a first surface of the first semiconductor wafer, the first semiconductor wafer having a first dummy metal pattern disposed within the first insulating material and on the first surface, the first semiconductor wafer having a second surface opposing the first surface, a percentage of metal surface area of the first dummy metal pattern relative to a total surface area of the first dummy metal pattern in a first range from about 40% to about 90%; providing a second semiconductor wafer having a second conductive pad disposed within a second insulating material and on a third surface of the second semiconductor wafer, the second semiconductor wafer having a second dummy metal pattern disposed within the second insulating material and on the third surface, the second semiconductor wafer having a fourth surface opposing the third surface, a percentage of metal surface area of the second dummy metal pattern relative to a total surface area of the second dummy metal pattern in a second range from about 40% to about 90%; forming a first redistribution via and a first RDL in the first semiconductor wafer from the second surface to the first conductive pad, the first redistribution via coupled to the first conductive pad; forming a second redistribution via and second RDL in the second semiconductor wafer from the fourth surface to the second conductive pad, the second redistribution via coupled to the second conductive pad; the first RDL disposed within and on the second surface of the first semiconductor wafer, the first RDL coupled to the first redistribution via; the second RDL disposed within and on the fourth surface of the second semiconductor wafer, the second RDL coupled to the second redistribution via; planarizing the second surface of the first semiconductor wafer; planarizing the fourth surface of the second semiconductor wafer; coupling the fourth surface of the second semiconductor wafer to the second surface of the first semiconductor wafer; and applying heat and pressure to the first semiconductor wafer and the second semiconductor wafer, wherein insulating material of the second surface is bonded to insulating material of the fourth surface, and the first RDL is bonded to the second RDL. The first dummy metal pattern may include a plurality of first dummy metal features that are electrically isolated from each other and from the first conductive pad. The second dummy metal pattern may comprise a plurality of second dummy metal features that are electrically isolated from each other and from the second conductive pad. At least one of the first semiconductor wafer and the second semiconductor wafer may have a wafer edge exclusion (WEE) between about 0.5 mm and about 1.5 mm. After planarization, at least one of the second surface of the first semiconductor wafer and the fourth surface of the second semiconductor wafer may have a maximum step height difference of less than about 400 Å.

In another embodiment, a method of manufacturing 3DIC structures includes the steps of: providing a first semiconductor wafer and a second semiconductor wafer, the first semiconductor wafer and the second semiconductor wafer both having a contact pad disposed within an insulating material and on a first surface thereof, the first semiconductor wafer and the second semiconductor wafer both having a dummy metal pattern disposed within the insulating material and on the first surface, the dummy metal pattern comprising a plurality of dummy metal features electrically isolated from each other and the contact pad; forming a redistribution via and an RDL in the first semiconductor wafer and the second semiconductor wafer from a second surface thereof, the second surface opposing the first surface, the redistribution via coupled to the contact pad; the RDL disposed within and on the second surface of the first semiconductor wafer and the second semiconductor wafer, the RDL coupled to the redistribution via; planarizing the second surface of the first semiconductor wafer and the second semiconductor wafer; aligning and coupling the second surface of the second semiconductor wafer to the second surface of the first semiconductor wafer; and applying heat and pressure to the first semiconductor wafer and the second semiconductor wafer, wherein application of pressure forms a bond between insulating material of the first semiconductor wafer and insulating material of the second semiconductor wafer, and wherein application of heat forms a bond between the RDL of the first semiconductor wafer and the RDL of the second semiconductor wafer. The contact pad of the first semiconductor wafer and the contact pad of the second semiconductor wafer have a slotted metal pattern. The slotted metal pattern of the contact pad may have a top surface area larger than a top surface area of the redistribution via. The slotted metal pattern includes a plurality of metal bars. Slots between the plurality of metal bars are filled with dielectric material to form dielectric bars. The method further includes the step of forming the redistribution via directly over the slotted metal pattern of the contact pad. A percentage of metal surface area of the slotted metal pattern of the contact pad facing the redistribution via relative to a total surface area of the contact pad may be in a range from about 50% to about 90%. The slotted metal pattern of the contact pad may be an electrically contiguous structure. The method may further include the step of forming an etch stop layer over the insulating material of the first semiconductor wafer and the second semiconductor wafer. The method may further include the step of forming a dielectric layer over the etch stop layer, and forming a dielectric layer over the dielectric layer. The etch stop layer may comprise silicon nitride and the dielectric layer may comprise silicon oxy-nitride. A percentage of metal surface area of the dummy metal pattern relative to a total surface area of the dummy metal pattern may be in a range from about 40% to about 90%. The planarization may comprise chemical mechanical polishing.

In yet another embodiment, a 3DIC device includes: a first substrate having a first conductive pad disposed therein, the first conductive pad on a first surface of the first substrate, the first substrate having a first dummy metal pattern disposed within the first substrate and on the first surface; a second substrate having a second conductive pad disposed therein, the second conductive pad on a second surface of the second substrate, the second substrate having a second dummy metal pattern disposed within the second substrate and on the second surface; a first redistribution via in the first substrate, the first redistribution via coupled to the first conductive pad; a second redistribution via in the second substrate, the second redistribution via coupled to the second conductive pad; a first RDL disposed over the first substrate and the first redistribution via, the first RDL coupled to the first conductive pad; a second RDL disposed over the second substrate and the second redistribution via, the second RDL coupled to the second conductive pad; a first insulating material disposed over the first substrate and adjacent the first RDL; and a second insulating material disposed over the second substrate and adjacent the second RDL. The first insulating material is bonded to the second insulating material, and the first RDL is bonded to the second RDL. A ratio of metal surface area of at least one of the first dummy metal pattern and the second dummy metal pattern to a total surface area of the at least one of the first dummy metal pattern and the second dummy metal pattern is in a range from about 50% to about 95%. The first dummy metal pattern comprising a plurality of first metal features that are electrically isolated from each other and the first conductive pad. The second dummy metal pattern comprising a plurality of second metal features that are electrically isolated from each other and the second conductive pad. At least one of the first metal features or at least one of the second metal features comprises a cross-sectional shape corresponding to a circle, an ellipse, an ellipsoid, or a polygon having at least three sides. At least one of the first conductive pad and the second conductive pad comprises a slotted metal pattern, and a percentage of metal surface area of the slotted metal pattern relative to a total surface area of the at least one of the first conductive pad and the second conductive pad is in a range from about 50% to about 90%. A percentage of metal surface area of the at least one of the first dummy metal pattern and the second dummy metal pattern relative to a total surface area of the at least one of the first dummy metal pattern and the second dummy metal pattern may be about 80%. The 3DIC device may further include a first etch stop layer over the first substrate, the first etch stop layer adjacent to at least a portion of the first redistribution via, and a second etch stop layer over the second substrate, the second etch stop layer adjacent to at least a portion of the second redistribution via.

Benefits, other advantages, and solutions to problems have been described with regard to specific embodiments; however, benefits, advantages, solutions to problems, and any component(s) that may cause any benefit, advantage, or solution to occur or become more pronounced are not to be construed as a critical, required, or essential feature or component.

As used herein, the terms "comprises," "comprising," "includes," "including," "has," "having," or any contextual variant thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Furthermore, unless expressly stated to the contrary, "or" refers to an inclusive or and not an exclusive or. That is, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless the context clearly indicates otherwise. Also, as used in the description herein, the meaning of "in" includes "in" and "on," unless the context clearly indicates otherwise.

Examples or illustrations provided herein are not to be regarded in any way as restrictions on, limits to, or express definitions of any term or terms with which they are associated. Instead, these examples or illustrations are to be regarded as being described with respect to one particular embodiment and as merely illustrative. Those skilled in the art will appreciate that any term or terms with which these examples or illustrations are associated will encompass other embodiments that may or may not be given therewith or elsewhere in the specification, and all such embodiments are intended to be included within the scope of that term or terms. Language designating such non-limiting examples and illustrations includes, but is not limited to: "for example," "for instance," "e.g.," "in a representative embodiment," or "in one embodiment." Reference throughout this specification to "one embodiment," "an embodiment," "a representative embodiment," "a particular embodiment," or "a specific embodiment," or contextually similar terminology, means that a particular feature, structure, property, or characteristic described in connection with the embodiment is included in at least one embodiment and may not necessarily be present in all embodiments. Thus, respective appearances of the phrases "in one embodiment," "in an embodiment," or "in a specific embodiment," or similar terminology in various places throughout this specification are not necessarily referring to the same embodiment. Furthermore, particular features, structures, properties, or characteristics of any specific embodiment may be combined in any suitable manner with one or more other embodiments.

Spatially relative terms, such as "under," "below," "lower," "upper," "above," "higher," "adjacent," "interadjacent," "interposed," "between," or the like, may be used herein for ease of description to representatively describe one or more elements or features in relation to other elements or features as representatively illustrated in the Figures. Spatially relative terms are intended to encompass different orientations of the device in use or operation, in addition to orientations illustrated in the Figures. An apparatus or device may be otherwise spatially transformed (e.g., rotated by 90 degrees) and the spatially relative descriptors used herein may likewise be transformed accordingly.

Although steps, operations, or procedures are presented in a specific order, this order may be changed in different embodiments. In some embodiments, to the extent multiple steps are shown as sequential in the specification or claims, some combination of such steps in alternative embodiments may be performed at the same time or in a different order. The sequence of operations described herein may be interrupted, suspended, or otherwise controlled by another process.

Although representative embodiments and their advantages have been described in detail, it should be understood that various changes, substitutions, and alterations may be made herein without departing from the spirit and scope of the disclosure as included by the appended claims. Moreover, the scope of the present disclosure is not intended to be limited to the particular embodiments of any process, product, machine, manufacture, assembly, apparatus, composition of matter, means, methods, or steps described in the specification. As one skilled in the art will readily appreciate from the disclosure, various processes, products, machines, manufacture, assemblies, apparatuses, compositions of matter, means, methods, or steps, whether presently existing or later developed, that perform substantially the same function or achieve substantially the same result as the corresponding representative embodiments described herein may be utilized according to the disclosure herein. The appended claims are intended to include within their scope such processes, products, machines, manufacture, assemblies, apparatuses, compositions of matter, means, methods, or steps.

What is claimed is:

1. A method for bonding wafers, the method comprising:
providing a first wafer having a first dummy metal pattern disposed within and on a first surface of the first wafer, the first wafer having a second surface opposing the first surface, a percentage of metal surface area of the first dummy metal pattern relative to a total surface area of the first dummy metal pattern in a first range from about 40% to about 90%;
providing a second wafer having a second dummy metal pattern disposed within and on a third surface of the second wafer, the second wafer having a fourth surface opposing the third surface, a percentage of metal surface area of the second dummy metal pattern relative to a total surface area of the second dummy metal pattern in a second range from about 40% to about 90%;
planarizing the second surface of the first wafer;
planarizing the fourth surface of the second wafer; and
hybrid bonding the fourth surface to the second surface.

2. The method of claim 1, wherein:
the first dummy metal pattern comprises a plurality of first dummy metal features that are electrically isolated from each other; and
the second dummy metal pattern comprises a plurality of second dummy metal features that are electrically isolated from each other.

3. The method of claim 2, wherein:
at least one of the first wafer and the second wafer have a wafer edge exclusion (WEE) ranging from about 0.5 mm to about 1.5 mm; and
after planarization, at least one of the second surface and the fourth surface has a maximum step height difference of less than about 400 Å.

4. A method of manufacturing three-dimensional integrated circuit (3DIC) structures, the method comprising:
providing a first semiconductor wafer and a second semiconductor wafer, the first semiconductor wafer and the second semiconductor wafer both having a contact pad disposed within an insulating material and on a first surface thereof, the first semiconductor wafer and the second semiconductor wafer both having a dummy metal pattern disposed within the insulating material and on the first surface, the dummy metal pattern comprising a plurality of dummy metal features electrically isolated from each other and the contact pad;
forming a redistribution via and a redistribution layer (RDL) in the first semiconductor wafer and the second semiconductor wafer from a second surface thereof, the second surface opposing the first surface, the redistribution via coupled to the contact pad, the RDL disposed within and on the second surface of the first semiconductor wafer and the second semiconductor wafer, the RDL coupled to the redistribution via;
planarizing the second surface of the first semiconductor wafer and the second semiconductor wafer;
aligning and coupling the second surface of the second semiconductor wafer to the second surface of the first semiconductor wafer; and
applying heat and pressure to the first semiconductor wafer and the second semiconductor wafer, wherein application of pressure forms a bond between insulating material of the first semiconductor wafer and insulating material of the second semiconductor wafer, and wherein application of heat forms a bond between the RDL of the first semiconductor wafer and the RDL of the second semiconductor wafer.

5. The method of claim 4, wherein the contact pad of the first semiconductor wafer and the contact pad of the second semiconductor wafer comprise a slotted metal pattern.

6. The method of claim 5, wherein:
   the slotted metal pattern of the contact pad has a top surface area larger than a top surface area of the redistribution via;
   the slotted metal pattern comprises a plurality of metal bars; and
   slots between the plurality of metal bars are filled with dielectric material to form dielectric bars.

7. The method of claim 5, further comprising forming the redistribution via directly over the slotted metal pattern of the contact pad.

8. The method of claim 5, wherein a percentage of metal surface area of the slotted metal pattern of the contact pad facing the redistribution via to a total surface area of the contact pad is in a range from about 50% to about 90%.

9. The method of claim 5, wherein the slotted metal pattern of the contact pad is an electrically contiguous structure.

10. The method of claim 4, further comprising forming an etch stop layer over the insulating material of the first semiconductor wafer and the second semiconductor wafer.

11. The method of claim 10, further comprising forming an oxide layer over the etch stop layer, and forming a dielectric layer over the oxide layer.

12. The method of claim 11, wherein the etch stop layer comprises silicon nitride and the dielectric layer comprises silicon oxy-nitride.

13. The method of claim 4, wherein a percentage of metal surface area of the dummy metal pattern relative to a total surface area of the dummy metal pattern is in a range from about 40% to about 90%.

14. The method of claim 4, wherein the planarization comprises chemical mechanical polishing.

15. A method of manufacturing a three-dimensional integrated circuit (3DIC) device, the method comprising:
   disposing a first conductive pad in a first substrate, the first conductive pad on a first surface of the first substrate;
   forming a first dummy metal pattern in the first substrate on the first surface;
   disposing a second conductive pad in a second substrate, the second conductive pad on a second surface of the second substrate;
   forming a second dummy metal pattern in the second substrate on the second surface;
   forming a first redistribution via in the first substrate, the first redistribution via coupled to the first conductive pad;
   forming a second redistribution via in the second substrate, the second redistribution via coupled to the second conductive pad;
   disposing a first redistribution layer (RDL) over the first substrate and the first redistribution via, the first RDL coupled to the first conductive pad;
   disposing a second RDL over the second substrate and the second redistribution via, the second RDL coupled to the second conductive pad;
   disposing a first insulating material over the first substrate and adjacent the first RDL;
   disposing a second insulating material over the second substrate and adjacent the second RDL;
   wherein:
      the first insulating material is bonded to the second insulating material;
      the first RDL is bonded to the second RDL; and
      a percentage of metal surface area of at least one of the first dummy metal pattern and the second dummy metal pattern relative to a total surface area of the at least one of the first dummy metal pattern and the second dummy metal pattern is in a range from about 40% to about 90%.

16. The method of claim 15, wherein forming the first dummy metal pattern comprises forming a plurality of first metal features that are electrically isolated from each other and the first conductive pad, and wherein forming the second dummy metal pattern comprises forming a plurality of second metal features that are electrically isolated from each other and the second conductive pad.

17. The method of claim 16, wherein at least one of the first metal features or at least one of the second metal features comprises a cross-sectional shape corresponding to a circle, an ellipse, an ellipsoid, or a polygon having at least three sides.

18. The method of claim 15, wherein at least one of the first conductive pad and the second conductive pad comprises a slotted metal pattern, and a percentage of metal surface area of the slotted metal pattern to a total surface area of the at least one of the first conductive pad and the second conductive pad is in a range from about 50% to about 90%.

19. The method of claim 15, wherein a percentage of metal surface area of the at least one of the first dummy metal pattern and the second dummy metal pattern relative to a total surface area of the at least one of the first dummy metal pattern and the second dummy metal pattern is about 80%.

20. The method of claim 15, further comprising:
   forming a first etch stop layer over the first substrate, the first etch stop layer adjacent to at least a portion of the first redistribution via; and
   forming a second etch stop layer over the second substrate, the second etch stop layer adjacent to at least a portion of the second redistribution via.

* * * * *